United States Patent
Chakraborty

(12) 
(10) Patent No.: US 8,519,437 B2
(45) Date of Patent: Aug. 27, 2013

(54) POLARIZATION DOPING IN NITRIDE BASED DIODES

(75) Inventor: Arpan Chakraborty, Goleta, CA (US)

(73) Assignee: Cree, Inc., Durham, NC (US)

( * ) Notice: Subject to any disclaimer, the term of this patent is extended or adjusted under 35 U.S.C. 154(b) by 197 days.

(21) Appl. No.: 11/900,952

(22) Filed: Sep. 14, 2007

(65) Prior Publication Data

US 2009/0072254 A1    Mar. 19, 2009

(51) Int. Cl.
*H01L 33/30*    (2010.01)

(52) U.S. Cl.
USPC ............. 257/191; 257/94; 257/96; 257/97; 257/E29.11; 257/E33.048

(58) Field of Classification Search
CPC . H01L 29/365; H01L 33/002; H01L 33/0025; H01L 33/025
USPC .............. 257/94, 96, 97, 101, 102, 103, 190, 257/191, E29.11, E33.048, E33.049
See application file for complete search history.

(56) References Cited

U.S. PATENT DOCUMENTS

| | | | |
|---|---|---|---|
| 3,896,479 A | 7/1975 | Di Lorenzo | |
| 4,152,044 A | 5/1979 | Liu | |
| 4,675,575 A | 6/1987 | Smith et al. | |
| 4,914,489 A | 4/1990 | Awano | 257/6 |
| 4,963,948 A | 10/1990 | Awano | 257/183 |
| 5,034,783 A * | 7/1991 | Chang et al. | 257/14 |
| 5,206,527 A * | 4/1993 | Kuwata | 257/191 |
| 5,477,436 A | 12/1995 | Bertling et al. | |
| 5,612,567 A | 3/1997 | Baliga | |
| 5,628,917 A | 5/1997 | MacDonald et al. | 216/2 |
| 5,705,321 A | 1/1998 | Brueck et al. | 430/316 |
| 6,046,464 A * | 4/2000 | Schetzina | 257/96 |
| 6,150,672 A | 11/2000 | Kaneko | 257/94 |

(Continued)

FOREIGN PATENT DOCUMENTS

| | | |
|---|---|---|
| EP | 1063711 A1 | 12/1920 |
| EP | 0 272 985 A2 | 6/1988 |

(Continued)

OTHER PUBLICATIONS

Notice of First Office Action from related China Patent Application No. 200710142217.6, dated: Jun. 22, 2009.

(Continued)

*Primary Examiner* — Anthony Ho
*Assistant Examiner* — Yu Chen
(74) *Attorney, Agent, or Firm* — Koppel, Patrick, Heybl & Philpott

(57) ABSTRACT

A light emitting device comprising a three-dimensional polarization-graded (3DPG) structure that improves lateral current spreading within the device without introducing additional dopant impurities in the epitaxial structures. The 3DPG structure can include a repeatable stack unit that may be repeated several times within the 3DPG. The stack unit includes a compositionally graded layer and a silicon (Si) delta-doped layer. The graded layer is compositionally graded over a distance from a first material to a second material, introducing a polarization-induced bulk charge into the structure. The Si delta-doped layer compensates for back-depletion of the electron gas at the interface of the graded layers and adjacent layers. The 3DPG facilitates lateral current spreading so that current is injected into the entire active region, increasing the number of radiative recombination events in the active region and improving the external quantum efficiency and the wall-plug efficiency of the device.

32 Claims, 13 Drawing Sheets

(56) References Cited

U.S. PATENT DOCUMENTS

| | | | |
|---|---|---|---|
| 6,330,111 B1 | 12/2001 | Myers | |
| 6,331,915 B1 | 12/2001 | Myers | |
| 6,331,944 B1 | 12/2001 | Monsma et al. | 365/171 |
| 6,372,536 B1* | 4/2002 | Fischer et al. | 438/46 |
| 6,389,051 B1 | 5/2002 | Van de Walle et al. | 372/45.01 |
| 6,482,711 B1* | 11/2002 | Nguyen et al. | 438/317 |
| 6,504,179 B1 | 1/2003 | Ellens et al. | 257/88 |
| 6,521,915 B2 | 2/2003 | Odaki et al. | 257/98 |
| 6,526,082 B1 | 2/2003 | Corzine et al. | 372/46.01 |
| 6,657,393 B2 | 12/2003 | Natsume | |
| 6,746,889 B1 | 6/2004 | Eliashevich et al. | |
| 6,765,242 B1* | 7/2004 | Chang et al. | 257/197 |
| 6,784,463 B2 | 8/2004 | Camras et al. | |
| 6,847,060 B2* | 1/2005 | Welser et al. | 257/197 |
| 6,878,975 B2 | 4/2005 | Hueschen | 257/104 |
| 6,882,051 B2 | 4/2005 | Majumdar et al. | 257/746 |
| 6,932,497 B1 | 8/2005 | Huang | |
| 6,949,774 B2 | 9/2005 | Parikh et al. | 257/104 |
| 7,083,490 B2 | 8/2006 | Mueller et al. | 445/24 |
| 7,087,936 B2 | 8/2006 | Negley | |
| 7,194,170 B2 | 3/2007 | Biegelsen | 385/116 |
| 7,214,626 B2 | 5/2007 | Huang | 438/734 |
| 7,491,626 B2* | 2/2009 | Gaska et al. | 438/483 |
| 2002/0015013 A1 | 2/2002 | Ragle | |
| 2002/0054495 A1 | 5/2002 | Natsume | |
| 2003/0015708 A1 | 1/2003 | Parikh | |
| 2003/0085409 A1 | 5/2003 | Shen et al. | |
| 2003/0218183 A1* | 11/2003 | Micovic et al. | 257/192 |
| 2004/0206966 A1* | 10/2004 | Sugawara et al. | 257/85 |
| 2004/0207313 A1 | 10/2004 | Omoto et al. | |
| 2005/0117320 A1 | 6/2005 | Leu et al. | 362/31 |
| 2005/0158637 A1 | 7/2005 | Kim et al. | |
| 2005/0173692 A1 | 8/2005 | Park | |
| 2005/0173728 A1 | 8/2005 | Saxler | |
| 2005/0219668 A1 | 10/2005 | Taghizadeh | |
| 2005/0224829 A1 | 10/2005 | Negley et al. | 257/99 |
| 2006/0081862 A1 | 4/2006 | Chua et al. | |
| 2006/0158899 A1 | 7/2006 | Avabe et al. | |
| 2006/0220046 A1 | 10/2006 | Yu et al. | 257/98 |
| 2006/0231860 A1 | 10/2006 | Mishra | |
| 2006/0267031 A1 | 11/2006 | Tasch et al. | |
| 2007/0007558 A1 | 1/2007 | Mazzochette | 257/239 |
| 2007/0041101 A1 | 2/2007 | Goosey et al. | 259/676 |
| 2007/0090383 A1 | 4/2007 | Ota et al. | |
| 2007/0268694 A1 | 11/2007 | Bailey et al. | 362/231 |
| 2008/0023689 A1* | 1/2008 | Kim et al. | 257/13 |
| 2008/0036364 A1 | 2/2008 | Li et al. | |
| 2011/0193057 A1 | 8/2011 | Sabathil et al. | |

FOREIGN PATENT DOCUMENTS

| | | |
|---|---|---|
| EP | 0881666 A2 | 12/1998 |
| EP | 0936682 A | 8/1999 |
| EP | 1189289 A1 | 3/2002 |
| EP | 1313187 A1 | 5/2003 |
| EP | 1349202 A | 10/2003 |
| EP | 1653255 | 5/2006 |
| EP | 1681509 | 7/2006 |
| EP | 2048718 | 4/2009 |
| FR | 2586844 | 3/1987 |
| FR | 2759188 | 8/1998 |
| FR | 2814220 | 3/2002 |
| JP | 11330552 | 11/1966 |
| JP | S63-288061 | 11/1988 |
| JP | H05-075101 | 3/1993 |
| JP | H05-283672 | 10/1993 |
| JP | 6268257 A | 9/1994 |
| JP | 7162038 A | 6/1995 |
| JP | 7176826 A | 7/1995 |
| JP | 8023124 A | 1/1996 |
| JP | 8070139 A | 3/1996 |
| JP | 8162671 A | 6/1996 |
| JP | 8274414 A | 10/1996 |
| JP | 9330630 A | 12/1996 |
| JP | 9148678 A | 6/1997 |
| JP | 9153642 A | 6/1997 |
| JP | 9162444 A | 6/1997 |
| JP | 11040850 | 7/1997 |
| JP | 9219556 A | 8/1997 |
| JP | 10012969 A | 1/1998 |
| JP | 10041581 A | 2/1998 |
| JP | 10065271 | 3/1998 |
| JP | 10145000 A | 5/1998 |
| JP | 10145002 A | 5/1998 |
| JP | 10033557 A | 12/1998 |
| JP | 10335757 A | 12/1998 |
| JP | 11074562 A | 3/1999 |
| JP | 11186659 A | 7/1999 |
| JP | 11191638 A | 7/1999 |
| JP | 11224972 A | 8/1999 |
| JP | 11238945 A | 8/1999 |
| JP | 11251684 A | 9/1999 |
| JP | 11298090 A | 10/1999 |
| JP | 2000-049363 | 2/2000 |
| JP | 2000068594 A | 3/2000 |
| JP | 2000-150920 | 5/2000 |
| JP | 2000133883 A | 5/2000 |
| JP | 2000150956 A | 5/2000 |
| JP | 2000244072 A | 9/2000 |
| JP | 2000307149 A | 11/2000 |
| JP | 2001168471 | 6/2001 |
| JP | 2001332770 A | 11/2001 |
| JP | 2002543594 | 12/2002 |
| JP | 2003-59938 | 2/2003 |
| JP | 2003-152219 | 5/2003 |
| JP | 2003258313 A | 9/2003 |
| JP | 2003318449 A | 11/2003 |
| JP | 2007-036010 | 2/2007 |
| JP | 2007-189239 | 7/2007 |
| WO | WO9831055 A1 | 7/1998 |
| WO | WO 98/37585 A1 | 8/1998 |
| WO | WO9856043 | 12/1998 |
| WO | WO9905728 A1 | 2/1999 |
| WO | WO9946822 A1 | 9/1999 |
| WO | WO0021143 | 4/2000 |
| WO | WO0076004 A1 | 12/2000 |
| WO | WO 01-41224 | 6/2001 |
| WO | WO 02-01608 | 1/2002 |
| WO | WO0205399 A1 | 1/2002 |
| WO | WO 02-11212 A1 | 2/2002 |
| WO | WO0211212 A | 2/2002 |
| WO | 03044870 | 5/2003 |
| WO | WO2004084316 | 9/2004 |
| WO | WO2004109813 | 12/2004 |
| WO | WO 2005/098976 A | 10/2005 |
| WO | WO2007005844 A | 1/2007 |
| WO | WO2007075815 | 7/2007 |
| WO | WO 2008/020913 | 2/2008 |
| WO | WO2008020913 | 2/2008 |

OTHER PUBLICATIONS

Extended Search Report from the European Patent Office re related European Patent Application No. 08160129.6, dated Dec. 15, 2008.

Asbeck P M. et al "Enhancement of Base Conductivity Via the Piezoelectric Effect in AlGaN/BaN HBTs", Solid State Electronics, Elsevier Science Publishers, Barking GB, vol. 44, No. 2, Feb. 2000, pp. 211-219, p. 213, left-hand column.

Johnson M A L et al. "New UV Light Emitter Based on AlGaN Heterostructures with Graded Electron and Hole Injectors", Materials Research Society Symposium—Proceedings 2002 Materials Research Society US, vol. 743, 2002, pp. 481-486, abstract; figure 2.

Simon J et al, "Polarization-induced 3-dimensional Electron Slabs in Graded AlGaN Layeras", Materials Research Society Symposium Proceedings 2006 Materials Research Society US, vol. 892, Nov. 28, 2005, pp. 417-422, abstract, 1 and 4.

Copending U.S. Appl. No. 11/443,741, filed Jun. 14, 2007.
Copending U.S. Appl. No. 11/685,761, filed Mar. 13, 2007.
Copending U.S. Appl. No. 11/939,059, filed Nov. 13, 2007.
PCT Search Report and Written Opinion PCT/US2007/086237, date: May 8, 2008 in related application.
PCT Search Report and Written Opinion PCT/US2007/12403, Date: Aug. 6, 2008.

PCT Search Report and Written Opinion PCT/US2007/086242, Date: Mar. 4, 2008.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
Office Action from related U.S. Appl. No. 11/600,617. Dated: Dec. 22, 2009.
Applied Physics Letters, vol. 81, No. 23, Dec. 2, 2002, "Realization of Wide Electron Slabs by Polarization Bulk Doping in Graded III-V Nitride Semiconductor Alloys", Jena et al., pp. 4395-4397.
Applied Physics Letters, vol. 78, No. 12, Mar. 19, 2001, "Photoluminescence and Electrical Characteristics of the Two-Dimensional Electron Gas in Si Delata-Doped GaN Layers", Teng et al., pp. 1688-1690.
Applied Physics Letters, vol. 77, No. 14, Oct. 2, 2000, "Growth of Si Delta-Doped GaN by Metalorganic Chemical-Vapor", Zhao, at al., pp. 2195-2197.
Applied Physics Letters, vol. 84, No. 9, Mar. 1, 2004, "AlGaN/GaN Polarization-Doped Field-Effect Transistor for Microwave Power Applications", Rajan at al., pp. 1591-1593.
Official Communication from the EPO regarding related European Application 08253301.9, dated: Nov. 17, 2009.
Second Office Action from related Chinese Application No. 200710142217.6, dated: Nov. 6, 2009.
Related Preliminary Korean Office Action , Korean Application No. 10-2004-7001033, dated Nov. 28, 2008.
Notice Requesting Submission of Opinion re related Korean Application No. 10-2004-7001033, dated: Mar. 9, 2009.
Sakai at al., "Experimental Investigation of Dependence of Electrical Characteristics on Device Parameters in Trench MOS Barrier Shottky Diodes", Proceedings of 1998 International Symposium on Power Semiconductor Devices & ICs, Kyoto, pp. 293-296, Jun. 1998.
Zhang AP et al, "Comparison of GaN P-I-N and Schottky Rectifier Performance" IEEE Transactions on Electron Devices, IEEE Inc. New York, US, vol. 48, No. 3, pp. 407-411, Mar. 2001.
European Search Report, Feb. 24, 2009, re related European Application No. EP 08253301.
European Search Report from related European Application No. 07254498.4.
(From related application) Canadian Patent Application No. 2,454,310, Office Action dated Feb. 9, 2010.
Invitation to Submit Applicant's Opinion (Summary) in Japanese Appeal Filing No. 2009-007421, Japanese Patent Application No. 2003-529535 mailed Dec. 7, 2010.
Examiner's Report to the Board (Summary) in Japanese Appeal Filing No. 2009-007421, Japanese Patent Application No. 2003-529535 mailed Dec. 7, 2010.
Office Action from U.S. Appl. No. 11/498,418, dated Dec. 16, 2009.
Response to Office Action from U.S. Appl. No. 11/498,418, filed Apr. 16, 2010.
Office Action from U.S. Appl. No. 11/498,418, dated Sep. 15, 2010.
Response to Office Action from U.S. Appl. No. 11/498,418, filed Dec. 13, 2010.

Office Action from U.S. Appl. No. 12/151,089, dated May 11, 2010.
Response to Office Action from U.S. Appl. No. 12/151,089, filed Oct. 11, 2010.
Office Action from U.S. Appl. No. 11/982,275, dated Jan. 13, 2011.
Office Action from U.S. Appl. No. 11/974,431, dated Feb. 16, 2011.
Office Action from U.S. Appl. No. 11/982,275, dated: Aug. 20, 2010.
Response to Office Action from U.S. Appl. No. 11/982,275, filed Nov. 9, 2010.
Office Action from U.S. Appl. No. 11/173,035, dated: Oct. 6, 2010.
Examiners interview in response to Office Action from U.S. Appl. No. 11/173,035 dated:Feb. 16, 2011.
Office Action from U.S. Appl. No. 11/974,431, dated: Sep. 22, 2010.
Response to Office Action from U.S. Appl. No. 11/974,431, filed Nov. 9, 2010.
Office Action from U.S. Appl. No. 11/818,818, dated: May. 11, 2010.
Response to Office Action from U.S. Appl. No. 11/818,818, filed Oct. 19, 2010.
Office Action from U.S. Appl. No. 11/974,431, dated: Apr. 14, 2010.
Response to Office Action from U.S. Appl. No. 11/974,431, filed Jul. 6, 2010.
Office Action from U.S. Appl. No. 11/173,035, dated: Apr. 1, 2010.
Response to Office Action from U.S. Appl. No. 11/173,035, filed Jun. 1, 2010.
Notification of National Application Upon the Preliminary Examination of Patent Application from Chinese Patent Application No. 200880100370.5 dated Jun. 1, 2010.
Notification on Publication and Entry into Procedure of Substantive Examination of Invention Patent Application from Chinese Patent Application No. 200880100370.5 dated Aug. 18, 2010.
Office Action from U.S. Appl. No. 11/498.418, dated: Dec. 16, 2009.
Office Action from U.S. Appl. No. 11/173.035, dated: Apr. 1, 2010.
Office Action from U.S. Appl. No. 12/151,089, dated: May 11, 2010.
Office Action from U.S. Appl. No. 11/818,818, dated: May 11, 2010.
Office Action from U.S. Appl. No. 11/982,275. dated: Aug. 20, 2010.
Office Action from U.S. Appl. No. 11/498,418, dated: Sep. 15, 2010.
Office Action from U.S. Appl. No. 11/974,431, dated: Nov. 29, 2011.
Office Action from U.S. Appl. No. 12/905,374, dated: Mar. 27, 2012.
Office Action from U.S. Appl. No. 13/045,246, dated: Apr. 5, 2012.
Notice of Reasons for Rejection for Japanese Patent Application No. JP 2007-143451 dated May 10, 2011.
Extended Search Report for European Patent Application No. 11154411.0 dated May 30, 2011.
Singh Madhusudan, et al., "Examination of Tunnel Junctions in the AlGaN/GaN System: Consequences of Polarization Charge", Applied Physics Letters, AIP, American Institute of Physics, Melville, NY, vol. 77, No. 12, Sep. 18, 2000, pp. 1867-1969.
Panda A.K. et al., "DC and High-Frequency Characteristics of GaN Based Impatts", IEEE Transactions on Electron Devices, IEEE Service Center, Piscataway, NJ, US vol. 48, No. 4, Apr. 1, 2001, pp. 820-823.
Summary of Notice of Reasons for Rejection for Japanese Patent Application No. 2008-262602 mailed Jul. 12, 2011.
Office Action for Canadian Patent Application No. 2,454,310 dated Aug. 30, 2011.
Summary of Notice of Reasons for Rejection for Japanese Patent Application No. 2008-264568 mailed Nov. 15, 2011.
Summary of Notice of Reasons for Rejection for counterpart Japanese Patent Application No. 2008-182592 mailed Nov. 22, 2011.
M.A.L. Johnson, et al., New UV Light Emitter Based on AlGaN Heterostructures with Graded Electron and Hole Injectors, Mat. Res. Soc. Symp. Proc. vol. 743, 2003, pp. 481-486.
Simon, John, et al., Polarization-Induced 3-Dimension Electron Slabs in Graded AlGaN Layers, Material Res. Soc. Symp. vol. 892, 2006, pp. 417-422.
Summary of Notice of Reasons for Rejection for Japanese Patent Application No. 2007-292302 mailed Jan. 24, 2012.
Examination Report for European Patent Application No. 07254498.4 dated Jan. 26, 2012.
"The American Heritage Dictionary". Library of Congress. New College Ed., 1976, pp. 867.
"Properties of Delta Doped Al0.25Ga0.75N and GaN Epitaxial Layers". Jeffrey S. Flynn, et al, Materials Research Society, 1 page.

"III-nitride ultraviolet light-emitting diodes with delta doping", K.H. Kim, et al, Applied Physics Letters, vol. 83, No. 3. Jul. 21, 2003. pp. 566-568.

Reduction of threading edge dislocation density in n-type GaN by Si delta-doping, Y.B. Pan, et al. Journal of Crystal Growth 286 (2006) 255-258.

Epitaxial Growth and Characterisation of Silicon Delta-Doped GaAs, AlAs and $Al_xGa_{1-x}As$, B. Sciana, et al. Crystal Res. Technol. 36 2001 8-10, pp. 1145-1154.

"Effects of periodic delta-doping on the properties of GaN:Si films grown on Si (111) substrates" L.S. Wang, et al, Applied Physics Letters. vol. 85, No. 34, Dec. 13, 2004. pp. 5881-5884.

"The effect of periodic silane burst on the properties of GaN on Si (111) substrates". Zang Keyan, et al. Singapore-MIT Alliance, E4-04-10 & Dept. of Materials Science and Engineering 4 pages.

European Search Report, EP 03 07 8515, dated: Feb. 2, 2004.

Partial European Search Report. EP 09 15 7557, dated: May 28, 2009.

Non-final Rejection, Korean Appl. No. 10-2003-7012710, dated: Aug. 8, 2008.

Non-final Rejection, Korean Appl. No. 10-2008-7026427, dated: Jan. 23. 2009.

Decision of Rejection and Decision of Dismissal of Amendment from Japanese Patent Application No. 2007-143451, dated Nov. 13, 2012.

Summary of Notice of Reasons for Rejection for Japanese Patent Application No. JP 2007-292302 dated Oct. 4, 2011.

Office Action from U.S. Appl. No. 13/045,246. Dated: Oct. 21, 2011.

Summary of Decision of Rejection from Japanese Patent Application No. 2008-262602, dated May 8, 2012.

Examination of European Patent Application No. 08 253 301.9-2222, dated Apr. 24. 2012.

Decision for Grant for Japanese Patent Application No. 2008-182592, dated Jul. 3. 2012.

Notice of Reasons for Rejection for Japanese Patent Application No. 2007-143451, dated Jul. 31, 2012.

\* cited by examiner

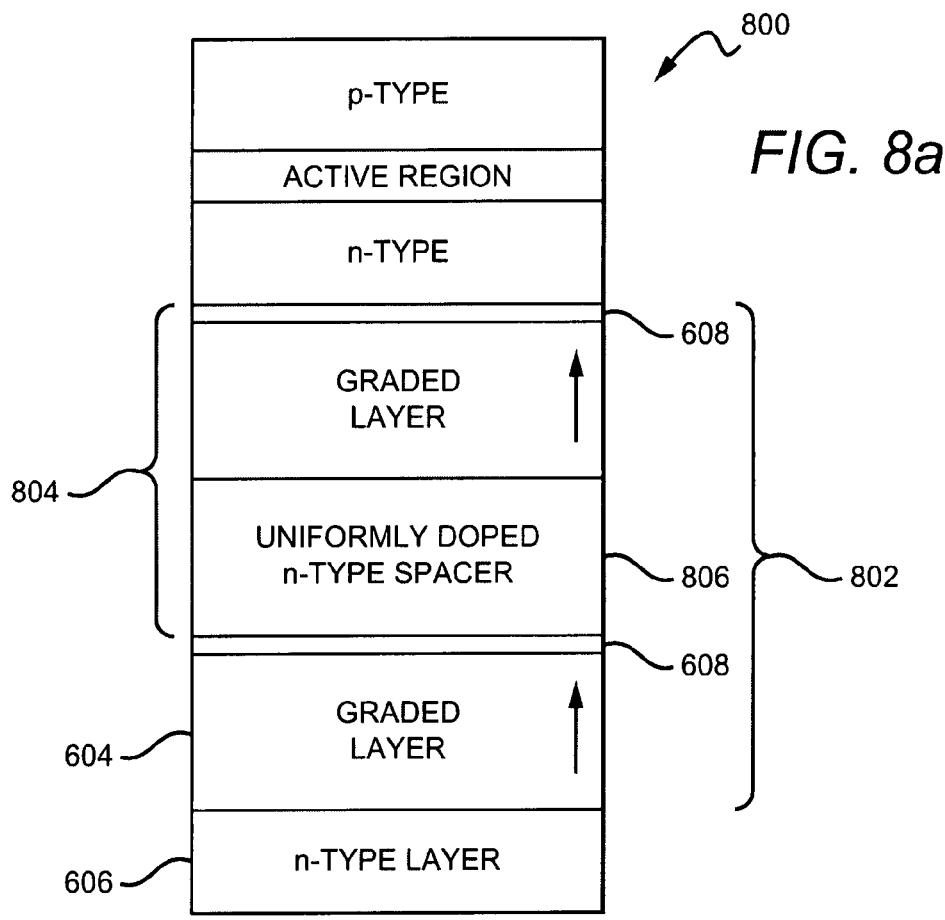
FIG. 8a
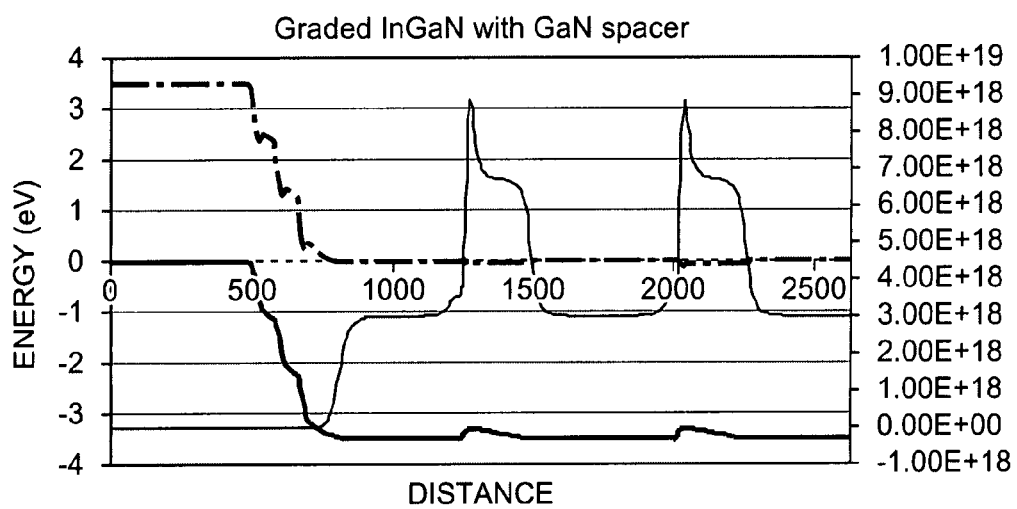
FIG. 8b
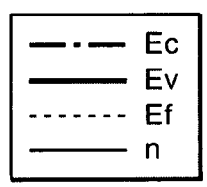

POLARIZATION DOPING IN NITRIDE BASED DIODES

This invention was made with Government support under Contract No. USAF 05-2-5507. The Government has certain rights in this invention.

BACKGROUND OF THE INVENTION

1. Field of the Invention

The invention relates generally to materials used in polar and semi-polar semiconductor devices and, more particularly, to polarization-induced bulk doping techniques to reduce the series resistance of light emitting diodes (LEDs) and improve lateral current spreading.

2. Description of the Related Art

Light emitting diodes (LED or LEDs) are solid state devices that convert electric energy to light, and generally comprise one or more active layers of semiconductor material sandwiched between oppositely doped layers. A bias is applied across the doped layers, injecting holes and electrons into the active layer where they recombine to generate light. Light is emitted from the active layer and from all surfaces of the LED. A typical high efficiency LED comprises an LED chip mounted to an LED package, wire-bonded to make electrical contacts, and encapsulated by a transparent medium. The efficient extraction of light is a major concern in the fabrication of LEDs.

A useful measure of the efficiency of an LED is the wall-plug efficiency. This is a measure of the electrical-to-optical power conversion. Much effort has been devoted to improving the wall-plug efficiency of LEDs. One way to do this is to decrease the series resistance of the LED which in turn lowers the operating voltage. Each internal component or layer of the LED contributes to the total series resistance. Thus, reducing the resistance of any component or layer would also reduce the total series resistance of the LED. Lowering the resistance of the p- and the n-cladding layers of an LED improves lateral current spreading, especially when the lateral current spreading is entirely due to a semiconductor layer rather than a high conductivity metal contact layer.

A known method for reducing resistance is by bulk doping an electronic material with impurities. With impurity doping the carrier concentration and transport properties are determined by temperature, dopant concentration and scattering mechanisms such as impurity doping and phonon scattering. The carrier mobility is always diminished by the ionized impurity scattering. The carrier concentration is reduced as temperature decreases. These problems led to research in the area of modulation doping which has been shown to improve low temperature carrier mobility in quantum-confined structures by many orders of magnitude.

Recently, group III-nitrides (e.g, AlN, BN, GaN, InN) have emerged as important materials for high-power microwave electronic and LED applications. Crystals such as group-III nitrides, when grown along the [0001] or the [000-1] direction of the wurtzite structure, exhibit large embedded electronic polarization fields owing to the lack of inversion symmetry in the crystal structure. This suggests the existence of a dipole in each unit cell of the crystal. For a homogeneous bulk crystal surface, dipoles inside the crystal cancel and leave net opposite charges on the opposing crystal surface, which is characterized by spontaneous polarization. Dipoles can also be created when a crystal is under strain, characterized by piezoelectric polarization. Both spontaneous polarization and piezoelectric polarization have been exploited for applications in communications, radar, infrared imaging, tunnel junction diodes, high-electron mobility transistors, memories, integrated optics, and in many other fields.

In one of the most popular nitride electronic devices, high-electron mobility transistors (HEMTs), the strong spontaneous and piezoelectric polarization fields in AlGaN and GaN have been used to make nominally undoped two-dimensional electron gases (2DEGs) in AlGaN/GaN heterostructures. [See Mishra et al., United States Patent Application Publication No. US 2006/0231860 A1 (Oct. 19, 2006)]. These devices can yield excellent power and efficiency performance at microwave frequencies.

Research in polarization doping in HEMT devices recently led to the development of three dimensional electron slabs that are usable as bulk doped carriers. This is done by grading the heterojunction of a material system such as AlGaN/GaN over a distance to spread the positive polarization charge into a bulk three-dimensional polarization background charge. The removal of ionized impurity scattering results in higher mobilities and better operation at lower temperatures. Experimental results have shown more than an order of magnitude improvement of carrier mobility at low temperatures for the polarization doped system over comparable donor-doped system. [See Jena et al., *Realization of wide electron slabs by polarization bulk doping in graded III-V nitride semiconductor alloys*, Applied Physics Letters, Vol. 81, No. 23 (December 2002)].

SUMMARY OF THE INVENTION

An embodiment of a light emitting device comprises an n-type semiconductor layer, a p-type semiconductor layer, and an active region interposed between the n-type layer and the p-type layer. A three-dimensional polarization-graded (3DPG) structure is disposed on the n-type layer the active region.

An embodiment of a three-dimensional polarization-graded (3DPG) lateral current spreading device, grown along the [0001] direction of a wurtzite crystal structure, comprises a retrograded layer that is compositionally graded from a first material to a second material over a grading distance and a silicon (Si) delta-doped layer disposed adjacent to the retrograded layer, such that the first material is proximate to the Si delta-doped layer.

An embodiment of a three-dimensional polarization-graded (3DPG) lateral current spreading device, grown along the [000-1] direction of a wurtzite crystal structure, comprises a graded layer that is compositionally graded from a second material to a first material over a grading distance and a silicon (Si) delta-doped layer disposed adjacent to the graded layer, such that the first material is proximate to the Si delta-doped layer.

BRIEF DESCRIPTION OF THE DRAWINGS

FIG. 1b is a graph of a computer simulation that corresponds to the device of FIG. 1a.

FIG. 1c is a graph of another computer simulation that corresponds to the device of FIG. 1a.

FIG. 2b is a graph of a computer simulation that corresponds to the device of FIG. 2a.

FIG. 3b is a graph of a computer simulation that corresponds to the device of FIG. 3a.

FIG. 4b is a graph of a computer simulation that corresponds to the device of FIG. 4a.

FIG. 5b is a graph of a computer simulation that corresponds to the device of FIG. 5a.

FIG. 6b is a graph of a computer simulation that corresponds to the device of FIG. 6a.

FIG. 6c is a graph of another computer simulation that corresponds to the device of FIG. 6a.

FIG. 7b is a graph of a computer simulation that corresponds to the device of FIG. 7a.

FIG. 8a is a cross-sectional view of a light emitting device, grown along the [000-1] direction or on N-face, according to an embodiment of the present invention.

FIG. 8b is a graph of a computer simulation that corresponds to the device of FIG. 8a.

FIG. 9b is a graph of a computer simulation that corresponds to the device of FIG. 9a.

FIG. 10b is a graph of a computer simulation that corresponds to the device of FIG. 10a.

DETAILED DESCRIPTION OF THE INVENTION

Figure 1A:
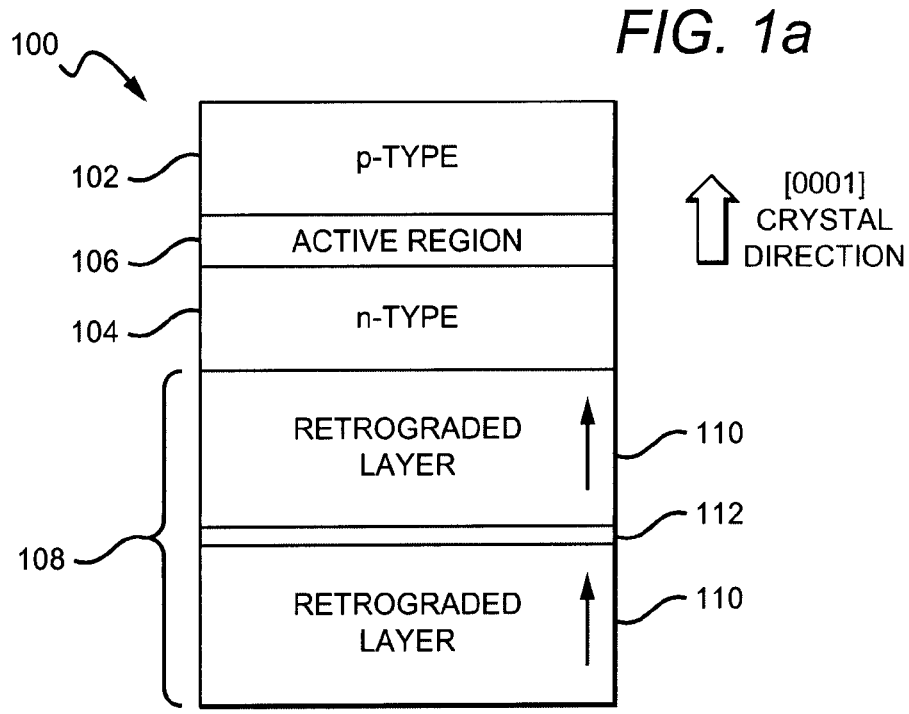
FIG. 1a is a cross-sectional view of a light emitting device according to an embodiment of the present invention, grown along the [0001] direction or on Ga-face.

The present invention as embodied in the claims provides improved materials and material configurations for use in semiconductor devices. Although the novel structures and methods presented are useful in many different semiconductor applications, they are particularly well-suited for use in polar or semi-polar nitride-based LED systems to reduce the series resistance and the operating voltage of these devices.

The series resistance $R_s$ of an LED can be modeled by the equation:

$$R_s \equiv R_c(n) + R_c(p) + R_b(n) + R_b(p)$$

where $R_c(n)$ and $R_c(p)$ represent the contact resistances for n- and p-contacts, respectively, and $R_b(n)$ and $R_b(P)$ represent the bulk resistance of the n- and p-type epitaxial layers, respectively. For example, a nominal 460 nm GaN LED has a bandgap of 2.7 eV. Assuming a lossless system, the LED would also have an operating voltage of 2.7 eV. However, in reality there are voltage penalties associated with each component contributing to the series resistance. This voltage penalty can be described as an "excess voltage" above the nominal bandgap voltage. Thus, by reducing the series resistance of the individual components, the excess voltage can be reduced, resulting in a significant improvement in the wall-plug efficiency of the device and lateral current spreading in the LEDs.

The largest contribution to the overall excess voltage required by a nitride-based LED comes from the bulk resistivity of the n-type layers. The excess voltage required by these layers also increases with higher operating currents of the LED. This makes the improvement potential even greater as solid state lighting devices trend toward operation at higher currents in order to reduce cost. Higher bulk n-resistance also prevents lateral current spreading, resulting in current crowding near the electrical contacts and resulting non-uniform illumination of the LEDs.

Traditionally, semiconductor materials in LEDs have been doped by introducing impurities into the crystal lattice of the various semiconductor layers. As a result of the impurities in the lattice, the mobility of carriers is reduced by impurity scattering as the carriers move through the lattice. Donor-doped materials also suffer from reduced carrier mobility as temperature decreases. The thermally activated carriers "freeze out" with lowering temperatures which results in less energetic carriers and less effective screening. And this in turn leads to significant ionized impurity scattering. Further, heavy doping often results in cracking, deterioration of the surface morphology, etc. Growing thicker layers is another way of reducing the bulk resistivity, but in most circumstances, thicker layers result in wafer bowing, cracking, etc., due to the strains associated with heteroepitaxy.

Embodiments of the present invention reduce the resistance of one or more of the epitaxial layers by engineering the band structure of polar nitride devices to induce excess free carriers in the bulk. Instead of additional impurity doping to increase the charge, the layers feature polarization-induced bulk doping. The discontinuity in the polarization across a heterojunction, for example, InGaN/GaN, forms a fixed polarization sheet charge at the heterojunction. By grading the heterojunction over a distance the sheet charge can be spread into a bulk three-dimensional (3D) polarization background charge.

The fixed background charge attracts free carriers from remote donor-like states to satisfy Poisson's equation and neutralize charge. The polarization bulk charge acts as a local donor with zero activation energy. Thus, a mobile 3D electron slab is formed and can be used just like bulk doped carriers without the associated impurity scattering and performance degradation at low temperatures. The carriers exhibit high mobilities, and the resistance of the epitaxial layers is reduced.

Lower resistance in the epitaxial layers allows electrons to move more easily through the crystal lattice, vertically and laterally, on their way to the active region. Good lateral movement in the lattice is important as it allows the current to spread out across the entire width of the device before the carriers reach the active region. Thus, the entire area of the active region is available for recombination and emission.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/ or sections, these elements, components, regions, layers and/or sections should not be limited by these terms. These terms are only used to distinguish one region, component, region, layer or section from another region, layer or section. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of semiconductor material may actually comprise several individual layers of material. Likewise, several "layers" of material may be considered functionally as a single layer. In other words the term "layer" does not denote an homogenous layer of semiconductor material. A single "layer" may contain various dopant concentrations and alloy compositions that are localized in sub-layers. Such sub-layers may function as buffer layers, contact layers or etch-stop layers, for example. These sub-layers may be formed in a single formation step or in multiple steps. Unless specifically stated otherwise, the Applicant does not intend to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIG. 1a illustrates an epitaxial device 100, grown along the [0001] crystal direction, according to an embodiment of the present invention. A bias can be applied across the layers with contacts (not shown) on both ends of the structure, for example. In response to the bias, charge carriers are transported through a p-type layer 102 and an n-type layer 104 to the active region 106 where radiative recombination takes place, causing light within a specific wavelength range to be emitted from the device 100. The device 100 can be included in many different LED packages that include elements such as reflectors, secondary optics, wavelength conversion materials, and many others.

The device 100 includes a three-dimensional polarization-graded structure (3DPG) 108 which is disposed adjacent to the n-type layer 104 opposite the active region 106 as shown. In this particular embodiment the 3DPG comprises two polarization-graded layers 110 with a silicon (Si) delta-doped layer 112 interposed between them. The graded layers 110 can comprise various materials including $Al_xGa_{1-x}N$, $In_xGa_{1-x}N$, $Al_xIn_{1-x}N$ and $Al_xGa_yIn_{1-x-y}N$ (where, $x+y \leq 1$), or any material like $Al_xB_yGa_zIn_{(1-x-y-z)}N$ (where, $x+y+z \leq 1$), for use in a (Al, B, Ga, In)N system. For purposes of convenience only the InGaN/GaN system and Si-delta-doped layer, grown along [0001] and [000-1] direction, will be referred to throughout the application as an exemplary system. It is understood that other material systems (for example AlGaN/GaN, AlInN/GaN, etc.), other delta-doped elements (for example Mg, Be, Zn, etc.), other crystal growth directions (for example [10-1-1], [10-11], [10-1-3], [10-13], [11-2-2], etc.) and other nitride systems are also possible.

Here, the graded layers 110 are retrograded from InGaN to GaN (for growth along [0001] direction or Ga-face) over a distance that is equal to the width of the graded layer 110 in the growth direction. Because the layers 110 are retrograded, InGaN having the highest concentration of In is disposed farthest from the junction with the n-type layer 104. The arrow in FIG. 1a indicates the direction of decreasing In concentration. In a preferred embodiment, the graded layers 110 are retrograded from $In_{0.1}Ga_{0.9}N$ to GaN over the grading distance (i.e., the width of the layer in the growth direction) for each graded layer 110. Grading the heterojunction spreads the positive polarization sheet charge into a bulk three-dimensional polarization background charge. As free electrons are induced in the retrograded layer, the polarization-induced electrons add to the existing electrons obtained by doping, and together they reduce the overall resistance of the structure 108. The 3DPG structure 108 allows the charge carriers be injected at various points on the bottom surface of the 3DPG, opposite the semiconductor layers 102, 104, 106. Because the carriers move easily in a lateral direction, by the time the current reaches the active region 106, it is spread more evenly across the entire face of the active region 106. Using more of active region for recombination significantly improves the illumination uniformity, the wall-plug efficiency, and the overall performance of a device.

The charge profile of the device is given by the divergence of the polarization field, which changes only along the growth direction of the layers. In a preferred embodiment a linear retrograde is used. A linear retrograde will yield an approximately uniform charge profile. However, it is possible to create non-uniform charge profiles using more exotic gradients, such as a parabolic gradient, for example.

As shown, it is possible to stack multiple graded layers 110 on to create a larger 3DPG structure. However, the negative sheet charge at the interface between the high concentration InGaN of one graded layer and the GaN portion of the adjacent graded layer causes a back-depletion of the electron gas and a discontinuity of the electron profile at the interface. This creates a hump-like barrier in the conduction band that results in electrical isolation. In order to compensate for the back-depletion a thin Si delta-doped layer 112 is interposed between the graded layers 110. The Si delta-doped layer 112 reduces the conduction band barrier nearly to flat-band. Si delta-doped GaN layers are known in the art and can be grown using known metalorganic chemical vapor deposition (MOCVD) processes. The Si delta-doped GaN layer compensates for the back-depletion, and provides free charges for continuity in vertical conductivity, without deteriorating the surface morphology of the device.

Figure 1B:
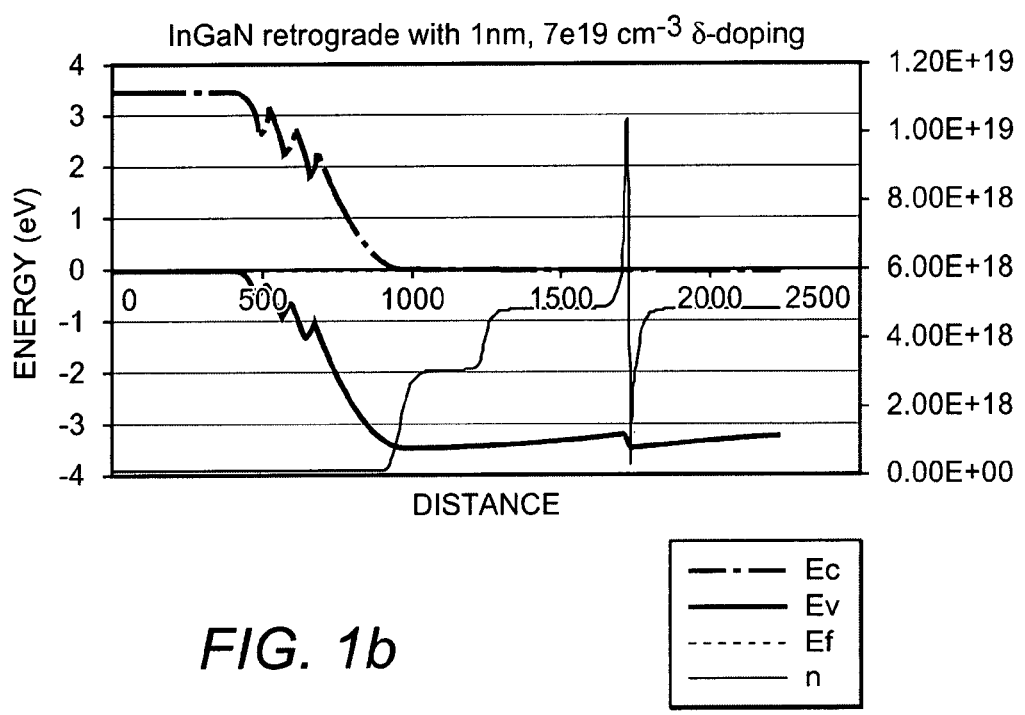
Figure 1C:
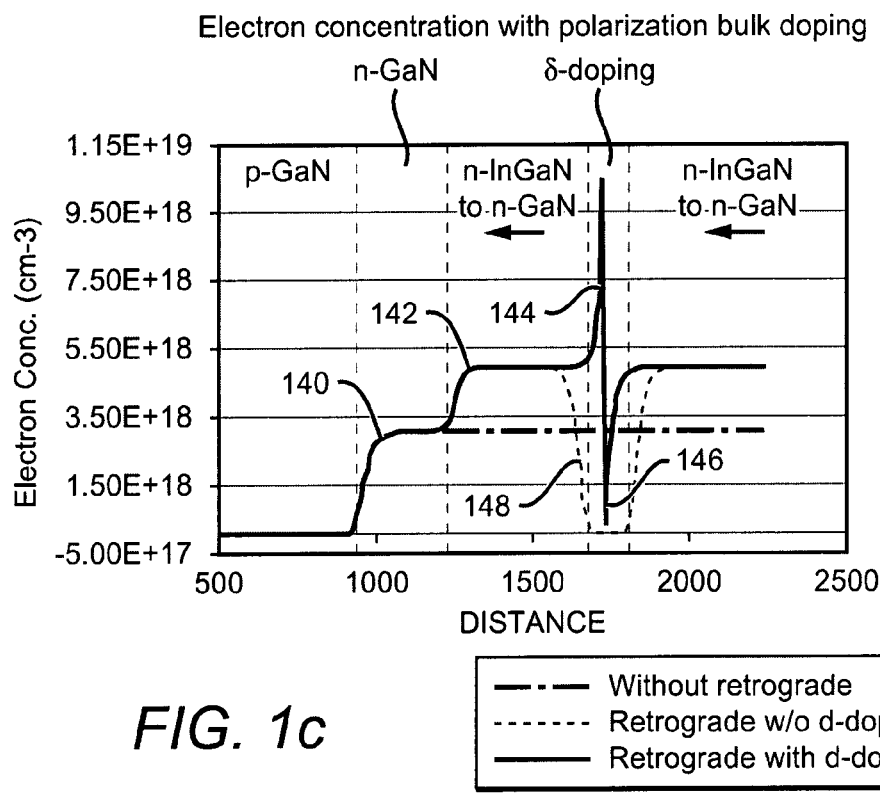

FIG. 1b and FIG. 1c are graphs of computer simulations illustrating the electron concentration profile along the height (i.e., in the growth direction which is [0001] in this case) of the device 100, where n represents the number of electrons at a given distance. FIG. 1b shows the valence band ($E_v$) and conduction band ($E_c$) energies measured in eV on the same graph for convenience. FIG. 1c shows the electron profile along the growth direction of the device 100 with the material interfaces delineated on the graph for reference. Three simulated data sets are shown on the graph: a device without retrograded layers; a device with retrograded layers but without a Si delta-doped layer; and a device with retrograded layers and with a Si delta-doped layer. The first rise in electron concentration 140 occurs at the interface of the p-type layer 102 (e.g., p-GaN) and the n-type layer 104 (e.g., n-GaN) somewhere within the active region 106. The second rise in electron concentration 142, which is a result of the polarization-induced bulk doping in the graded layers 110, appears at the interface of the n-type layer 104 and one of the graded layers 110.

After the second rise, a sharp positive spike in electron concentration 144 is noticeable followed by a sharp negative spike 146. These sharp features are due to the Si delta-doped layer 112 which is interposed between the two graded layers 110. The device having the retrograded layer but not having a Si delta-doped layer exhibits a large trough-like drop 148 in electron concentration at the interface between the graded layers. This is due to the back-depletion of carriers as discussed above. The low concentration of carriers over this distance introduces a great resistance to current flowing across the interface, or vertically along the structure, and is undesirable. Juxtaposed with the trough 148, the negative spike 146 exhibited by the device featuring a Si delta-doped region is much narrower (i.e., on the order of a single nanometer) and provides a much less resistive current path. There is no discontinuity in electron flow or path. The device 100 that features the retrograded layers and the Si delta-doped region exhibits a superior electron concentration profile, allowing for current to flow easily to the active region.

Figure 2A:
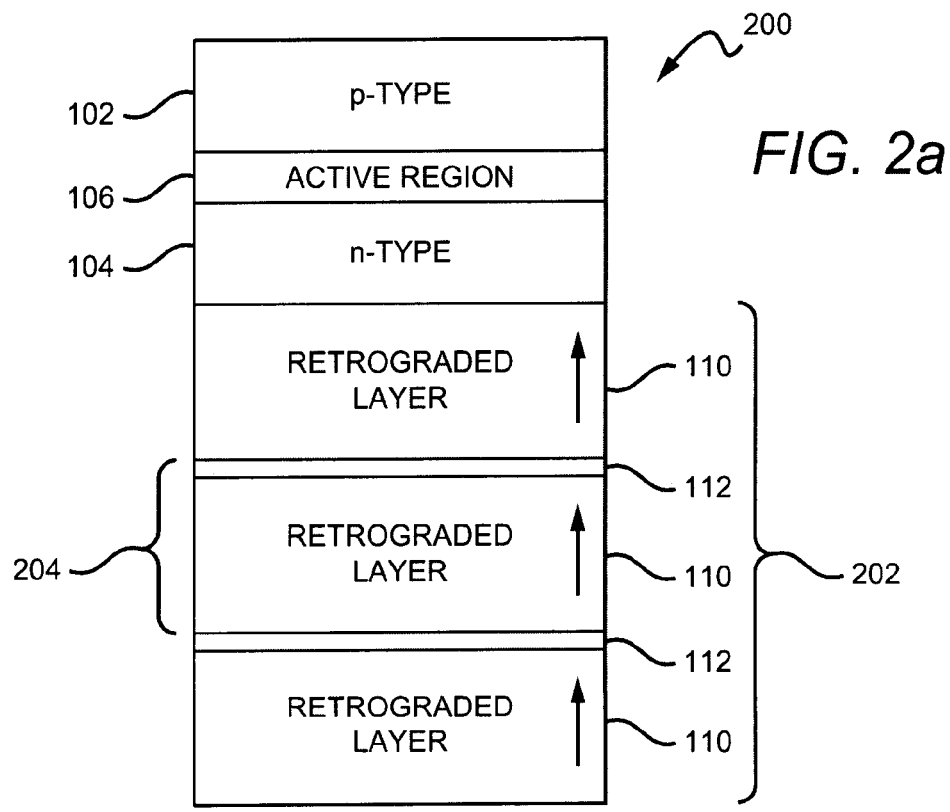
FIG. 2a is a cross-sectional view of a light emitting device according to an embodiment of the present invention, grown along the [0001] direction or on Ga-face.

FIG. 2a shows an epitaxial device 200 according to an embodiment of the present invention. The device 200, grown along the [0001] direction, functions similar to the device 100 and shares several common elements. In this particular embodiment the 3DPG structure 202 features an additional graded layer and Si delta-doped layer pair. The graded layers 110 in this embodiment are retrograded. Because total charge must be conserved, it is not possible to attain a high charge density over a thick graded layer. In order to achieve a higher bulk charge several graded layers 110 can be stacked on top of each other. The graded layers 110 are coupled together with Si delta-doped layers 112 in between to compensate for the back-depletion of charge carriers at the respective interfaces. The graded layer/delta-doped layer pair forms a repeatable stack unit 204. Additional stack units can be easily added to the structure in order to add thickness while retaining a desired charge density. The resulting stacked structure has a higher free electron concentration without the use of excessive external dopants which can raise the resistance of the device and cause cracking and other irregularities in surface morphology.

Figure 2B:
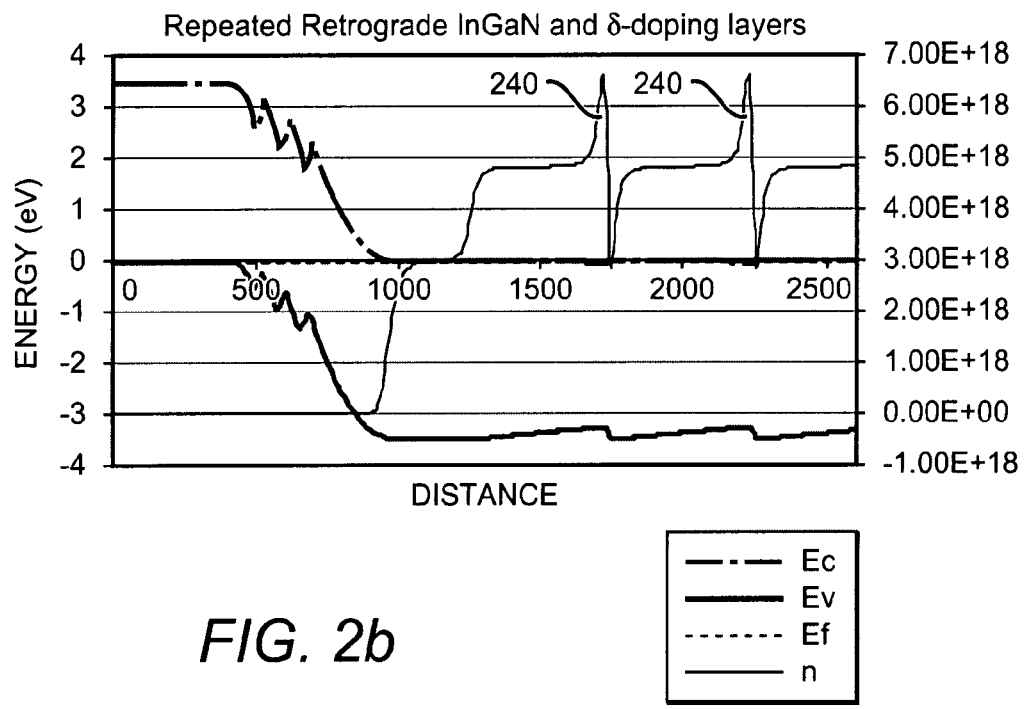

FIG. 2b is a graph of a computer simulation showing the electron concentration profile (n=number of electrons) over a distance (nm) in the growth direction of the device 200. The graph also shows the valence band ($E_v$) and conduction band ($E_c$) energies measured in eV on the same graph for convenience. Similarly as shown in FIG. 1b, the first and second rises in the electron concentration occur at the material interfaces on either side of the n-type layer 102. The thin spiked discontinuities 240 are due to the multiple Si delta-doped layers 112 that are interposed between the graded layers 110. The small negative spikes indicating a sharp drop in electron concentration are narrow enough that they do not introduce any significant resistance to the current path from the graded layers 110 to the active region 106.

Figure 3A:
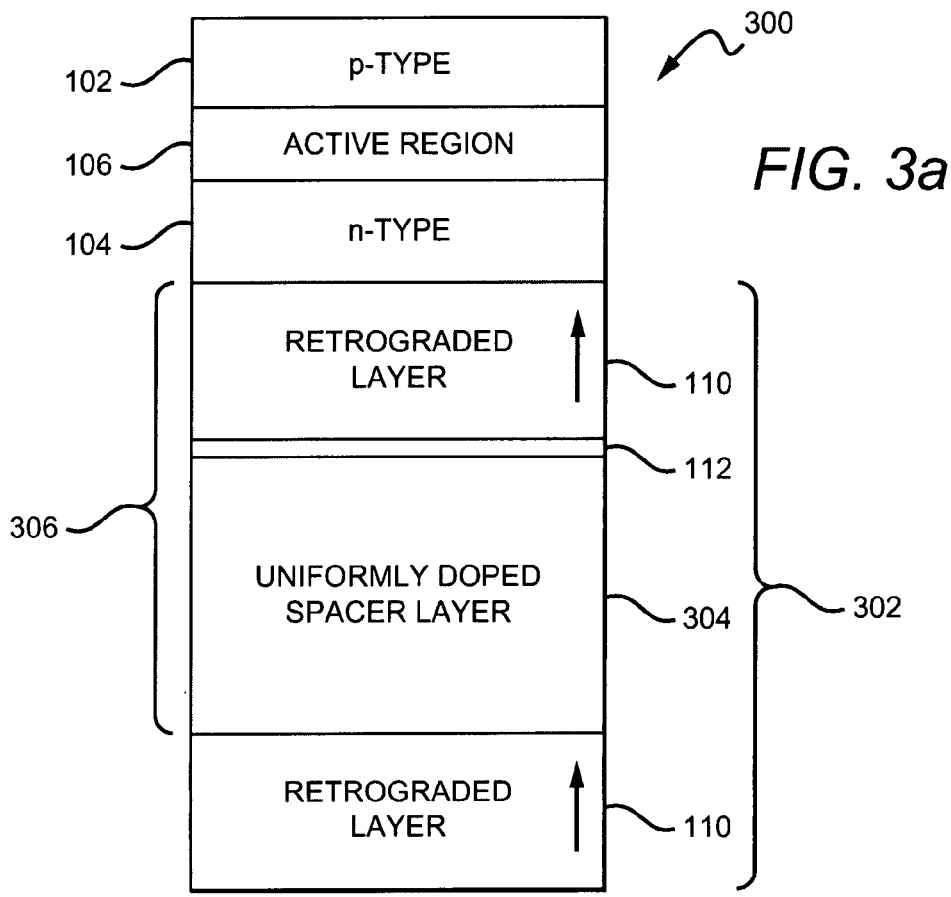
FIG. 3a is a cross-sectional view of a light emitting device, grown along the [0001] direction or on Ga-face, according to an embodiment of the present invention.

FIG. 3a illustrates an epitaxial device 300 according to an embodiment of the present invention. The device 300, grown along the [0001] direction, functions similar to the device 100 and shares many common elements. In this particular embodiment, the 3DPG structure 302 features a uniformly doped spacer layer 304 interposed between a Si delta-doped layer 112 and a graded layer 110. The graded layer 110, the Si delta-doped layer 112 and the spacer layer 304 form a repeatable stack unit 306. The stack unit may be repeated many times within the 3DPG structure 302. Each stack unit that is included adds thickness and charge to the device 300.

The spacer layer is doped uniformly with impurities at the same concentration as the graded layers 110. In the InGaN/GaN system, for example, the spacer layer 304 can comprise a GaN layer. The spacer layer 304 allows thicker devices to be grown. Thick layers can provide needed mechanical support to the device 300. Also, as thickness of the growth layers increases, the defect density in the crystal structure is reduced. Because GaN layers can be grown much faster than InGaN layers and under much more moderate growth conditions, it is more time-efficient to grow GaN layers to improve the morphology and add thickness to the devices.

Figure 3B:
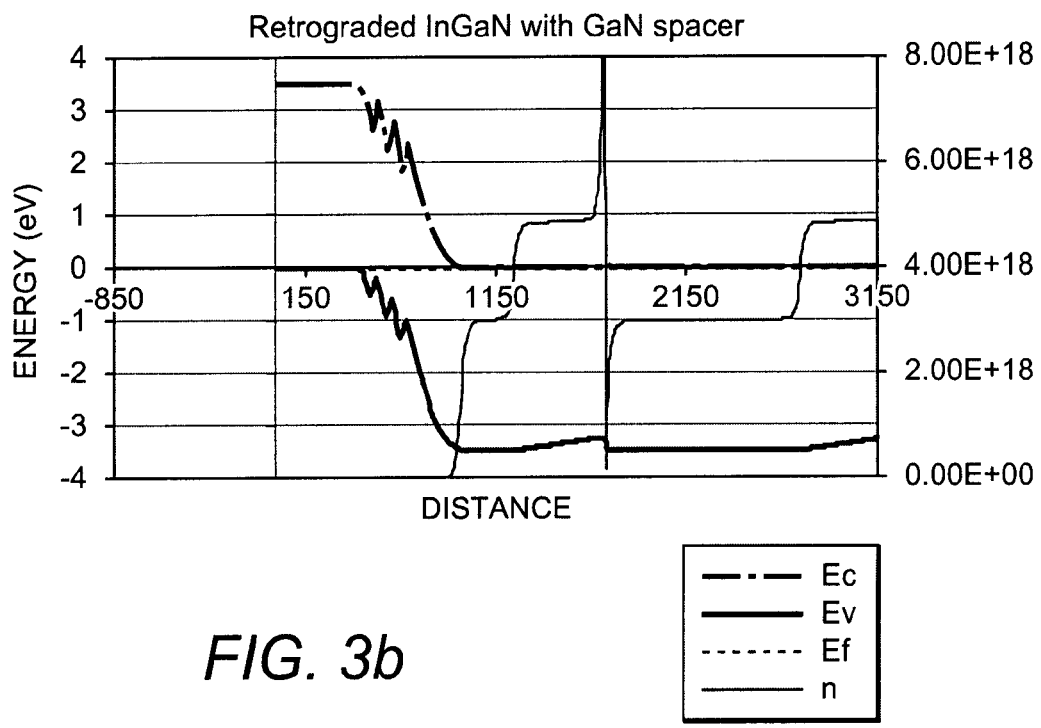

FIG. 3b shows a computer simulation of the electron concentration profile along the growth direction of the device 300. The profile is similar to those in FIG. 1b and FIG. 2b. After the Si delta-doped spike the electron concentration drops down to the level of the normally doped n-type layer 104. This is because the spacer layer 304 does not have polarization-induced doping. The level again rises at the interface of the spacer layer 304 and another graded layer 110.

Figure 4B:
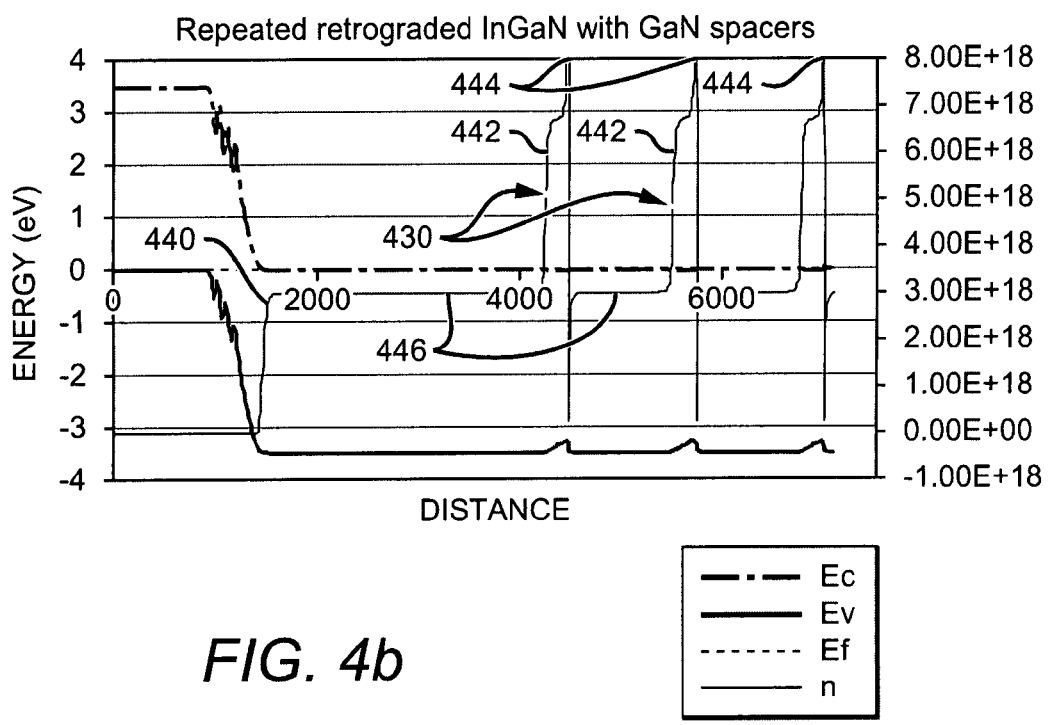
Figure 4A:
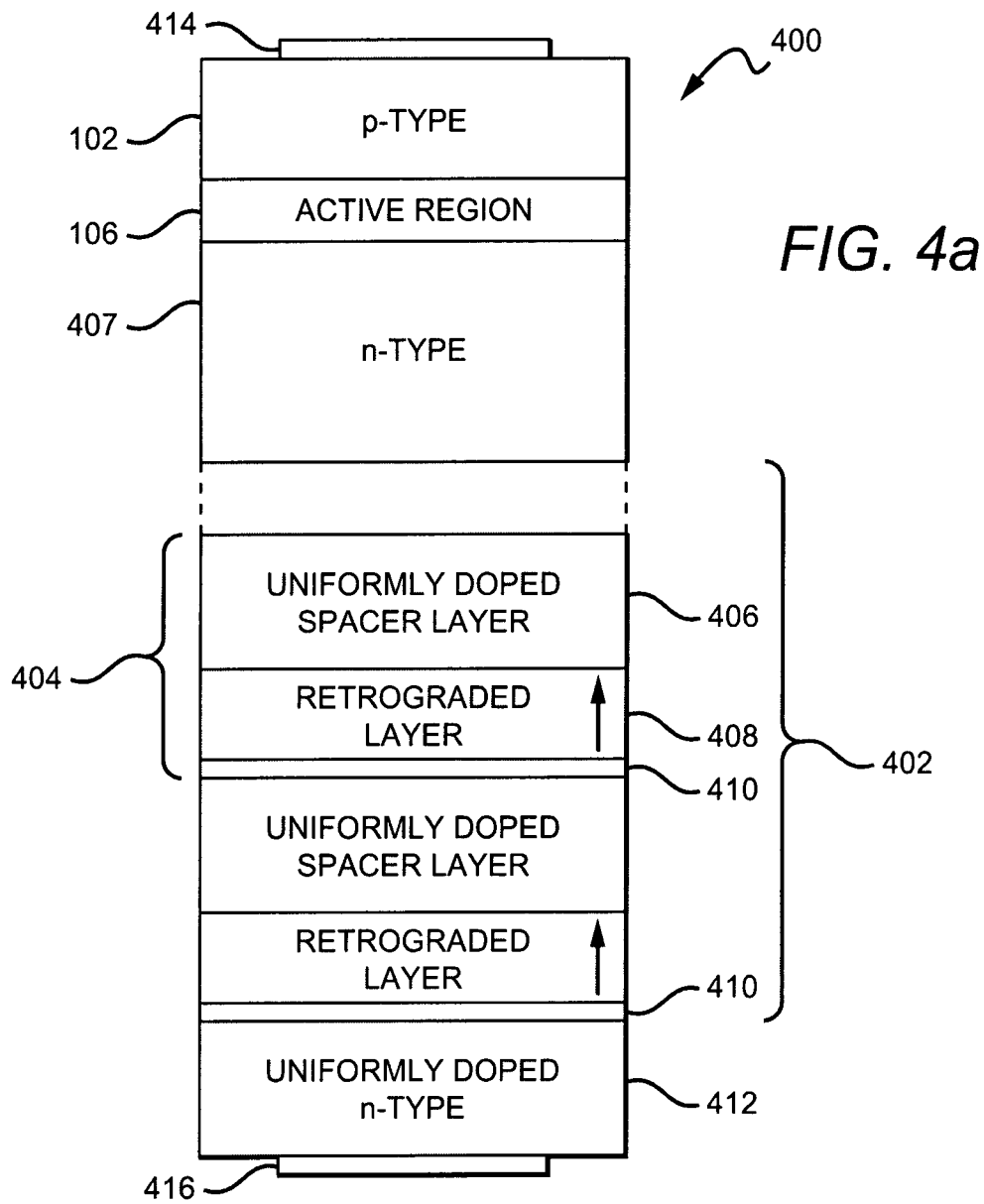
FIG. 4a is a cross-sectional view of a light emitting device, grown along the [0001] direction or on Ga-face, according to an embodiment of the present invention.

FIG. 4a depicts an epitaxial device 400 according to an embodiment of the present invention. The device 400, grown along the [0001] direction, is similar to device 300 and shares several common elements. In this particular embodiment, the 3DPG structure 402 comprises a series of repeatable stack units 404. Each stack unit 404 comprises a spacer layer 406, a graded layer 408 and a Si delta-doped layer 410. The first stack unit 404 is disposed such that the spacer layer 406 is adjacent to the n-type layer 407. A terminal layer 412 is adjacent to the Si delta-doped layer 410 in the stack unit 404 that is distal to the active region 106. In the InGaN/GaN system, the terminal layer 412 can comprise a InGaN layer or a GaN layer, for example. A p-contact 414 is disposed on the p-type layer 102. An n-contact 416 is disposed on the terminal layer 412 opposite the p-contact 414. Together the contacts 414, 416 provide a connection to a bias source (not shown).

A preferred embodiment of the device 400 is now described. FIG. 4a only shows two full stack units 404; however, the dashed lines along the sides of the device are meant to indicate that additional stack units may be repeated up to the interface with the n-type layer 407. A preferred embodiment of the device 400 comprises a stack unit 404 that is repeated 15-20 times within the 3DPG structure 402. Each stack unit 404 comprises: a linearly retrograded layer 408 (n-$In_{0.1}Ga_{0.9}N \rightarrow$ n-GaN), approx. 25 nm thick; a Si delta-doped layer 410, approx. 1 nm thick; and an n-GaN spacer layer 406, approx. 100 nm thick with 3e18 $cm^{-3}$ donor doping. In the preferred embodiment, the terminal layer 412 comprises an approx. 50 nm thick n-GaN layer with 3e18 $cm^{-3}$ donor doping, and the n-type layer 407 comprises a 1 μm thick n-GaN layer with 3e18 $cm^{-3}$ doping.

FIG. 4b shows the results of a computer simulation of the device 400 using the parameters of the preferred embodiment described above. The graph shows the electron concentration (n) along the growth direction (nm). The graph also shows the valence band ($E_v$) and conduction band ($E_c$) energies measured in eV on the same graph for convenience. The first rise in electron concentration 440 on the left-hand side of the graph is due to the interface at the n-type layer 407 which is doped with donor impurities to yield an n-type layer. The three tower-like structures 430 on the right side of the graph represent the increase in electron concentration due to three consecutive stack units 404. Although only two stack units 404 are shown in FIG. 4a, it is understood that additional stack units 404 may be added.

Each of the three structures 430 includes an initial rise 442 that corresponds with the graded layer 408, a spike feature 444 that corresponds with the Si delta-doped layer 410, and a leveled-off region 446 that corresponds with the spacer layer 406. The graph has been condensed for viewing convenience. Although three tower-like structures 430 appear in FIG. 4b, it is understood that, in the preferred embodiment, 15-20 of the tower-like structures would appear on the graph corresponding with each stack unit 404 within the 3DPG structure 402.

Figure 5A:
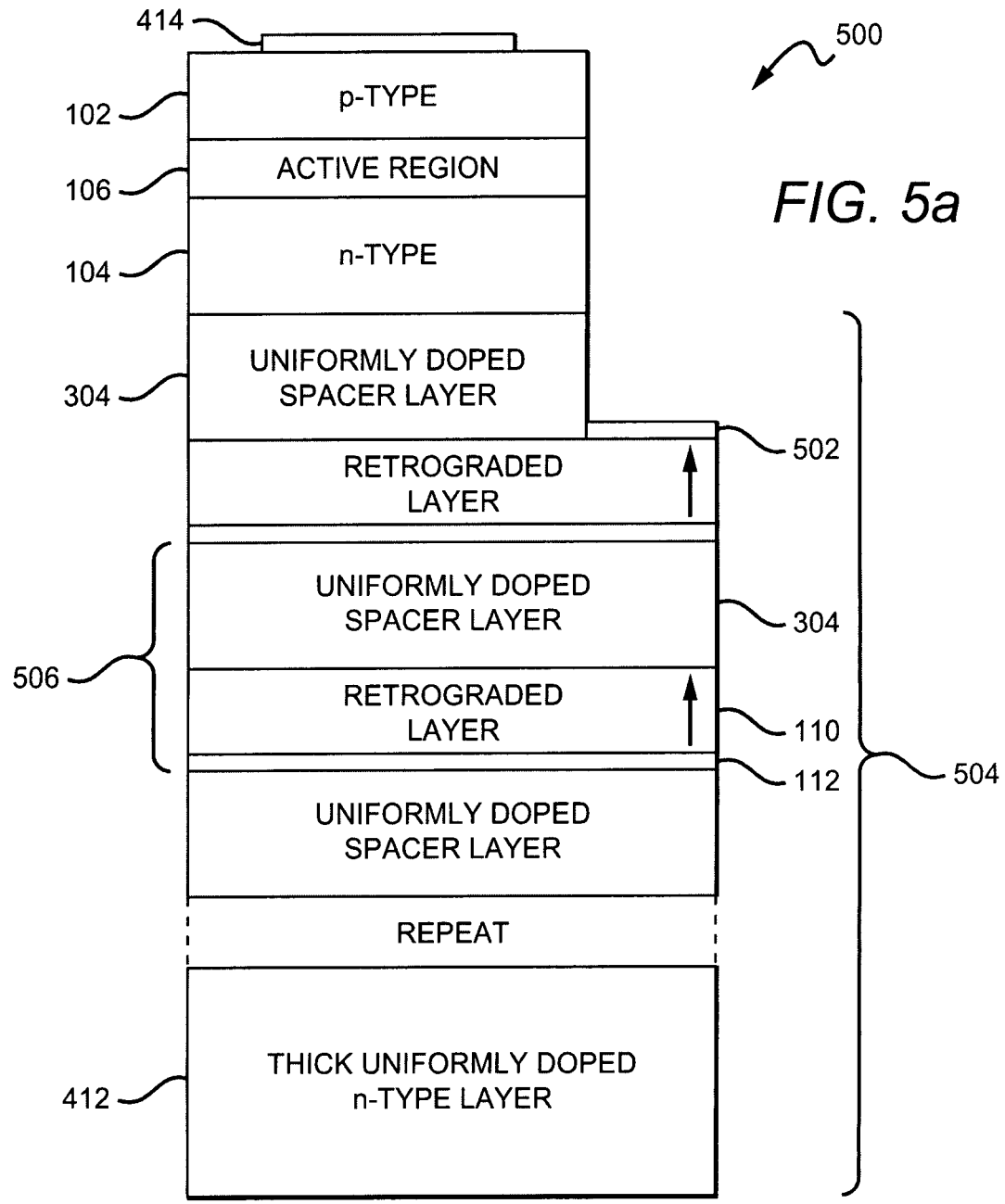
FIG. 5a is a cross-sectional view of a light emitting device, grown along the [0001] direction or on Ga-face, according to an embodiment of the present invention.

FIG. 5a illustrates an epitaxial structure 500 according to an embodiment of the present invention. The device 500, grown along the [0001] direction, is similar to the devices 300, 400 in some aspects and shares several common elements. The 3DPG structure 504 may contain several stack units 506. Each stack unit 506 comprises a spacer layer 304, a graded layer 110, and a Si delta-doped layer 112. In one embodiment there may be 15-20 stack units 506 within the 3DPG structure 504. A terminal layer 412 is disposed adjacent to the stack unit 506 farthest from the active region 106.

This particular embodiment features a top-side n-contact 502. The top-side n-contact 502 may be used to simplify the manufacturing process when devices are grown using a flip-chip process, for example. Flip-chip processes are known in the art. In this embodiment, the n-contact 502 contacts one of the graded layers 110 within the 3DPG structure 504. It is also possible to contact any of the other layers within the 3DPG structure 504 with the n-contact 502. The device may be etched down to the appropriate layer as shown in FIG. 5a. Alternatively, a hole may be formed from the top surface with a via providing a connection to the n-contact below, or the n-contact may be contacted from the side of the device. Other methods of connection may also be used.

Current enters the device at n-contact 502 and spreads laterally through the layers in the 3DPG structure 504. Thus, current may initially travel away from the active region 106 to spread laterally before traveling vertically toward the active region 106. The 3DPG structure 504 provides effective channels for the current to move laterally so that the current is spread across the entire area of the active region 106, increasing the radiative recombination and improving the illumination uniformity.

Figure 5B:
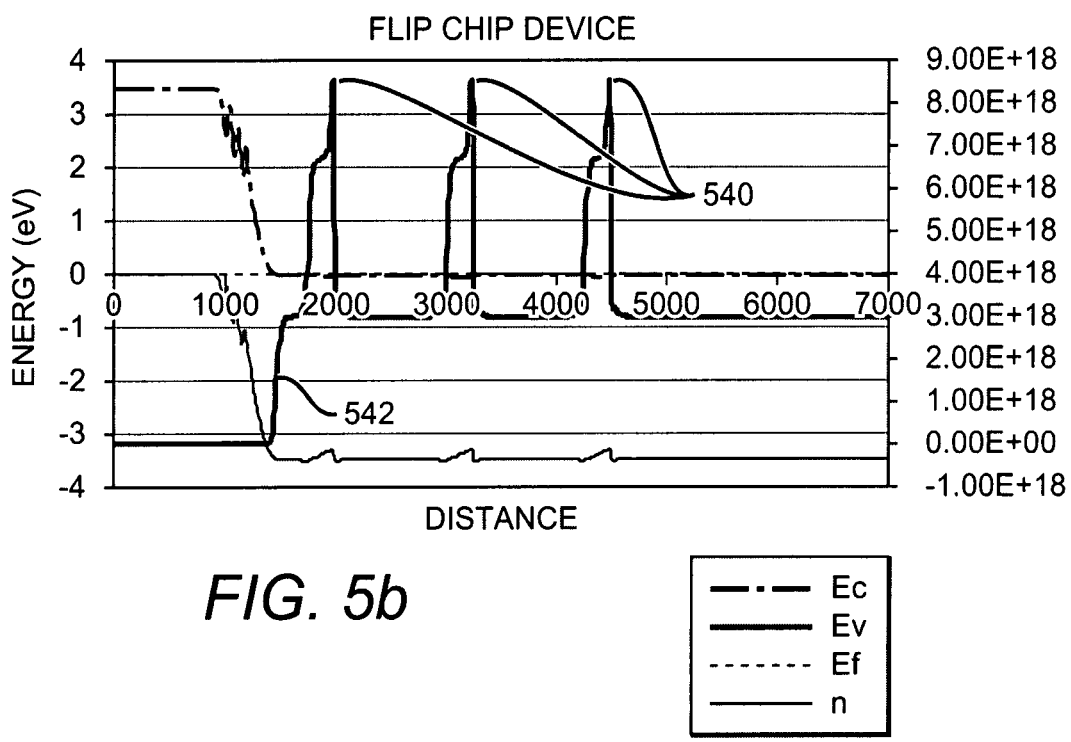

FIG. 5b shows a graph of a computer simulation of device 500. Like the previous graphs, the graph shows the electron concentration (n) along the growth direction (nm). The graph also shows the valence band ($E_v$) and conduction band ($E_c$) energies measured in eV on the same graph for convenience. The graph features three tower-like features 540 that correspond to three stack units 506 within the 3DPG structure 504 and an initial rise 542 at the p-n interface. It is understood that more or fewer stack units can be included within the 3DPG structure 504 according to design needs. The tower-like features 540 are close to the initial rise in electron concentration at the n-type layer 104. A thick terminal layer 412 is disposed adjacent to the stack unit 506 which is farthest from the active region 106. The terminal layer 412 can be uniformly doped and can provide mechanical support to the device 500 as well as improve the overall conductivity of the n-layer.

Figure 6A:
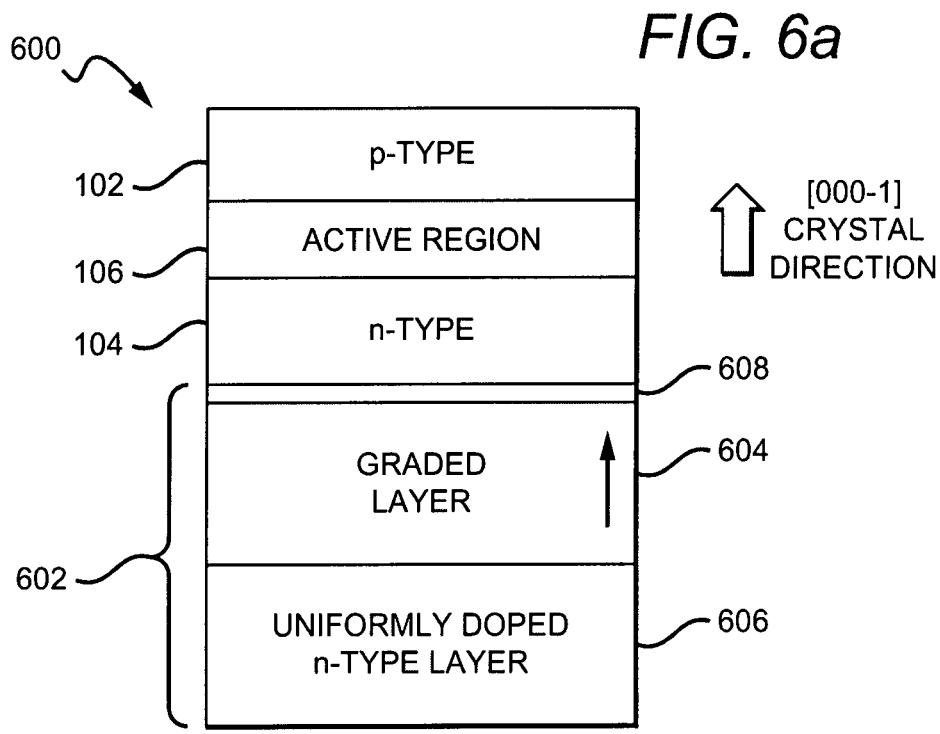
FIG. 6a is a cross-sectional view of a light emitting device according to an embodiment of the present invention, grown along the [000-1] direction or on N-face.

FIG. 6a shows an epitaxial semiconductor device 600 according to an embodiment of the present invention. The device 600 is similar to device 100 in some aspects and shares several common elements. However, unlike the device 100, the device 600 is grown along the [000-1] crystal direction. In the GaN material system, for example, the [000-1] direction represents the N-face of the crystal. The device features a 3DPG 602 that is disposed adjacent to the n-type layer 104. In this embodiment, the 3DPG 602 comprises a graded layer 604, a uniformly doped n-type layer 606, and a Si delta-doped layer 608.

The graded layer 604 can comprise various materials including $Al_xGa_{1-x}N$, $In_xGa_{1-x}N$, $Al_xIn_{1-x}N$ and $Al_xGa_yIn_{1-x-y}N$ (where, $x+y \leq 1$), or any material like $Al_xB_yGa_zIn_{(1-x-y-z)}N$ (where, $x+y+z \leq 1$), for use in a (Al, B, Ga, In)N system. Here, using the GaN/InGaN system, for example, the graded layer 604 is compositionally graded from GaN to InGaN over a grading distance (as indicated by the arrow in FIG. 6a) along the [000-1] crystal direction. In one embodiment, the graded layer is linearly graded from GaN to $In_{0.1}Ga_{0.9}N$ over the grading distance. Other compositions may also be used. The layer can be graded non-linearly as well. As discussed above, a Si delta-doped layer 608 is interposed between the graded layer 604 and the n-type layer 104 to compensate for the back-depletion of the electron gas at this interface. The Si delta-doped layer 608 is disposed on the InGaN side of the graded layer 604, and because the graded layer 604 is graded, rather than retrograded as in FIG. 1a, the Si delta-doped layer 608 is adjacent to the n-type layer 104.

Figure 6B:
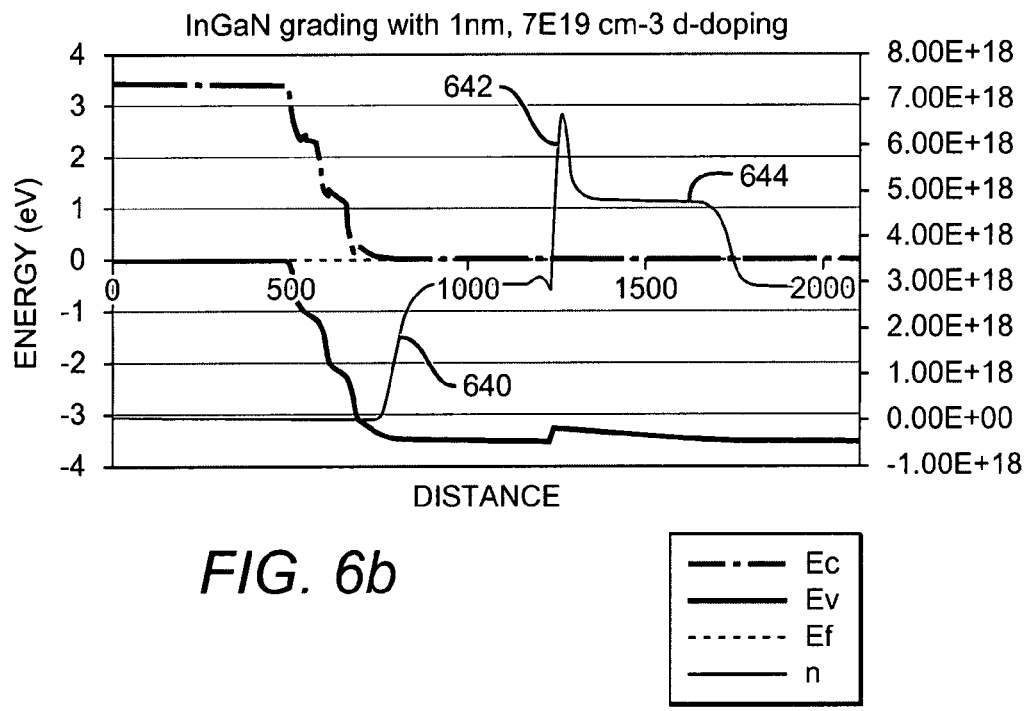
Figure 6C:
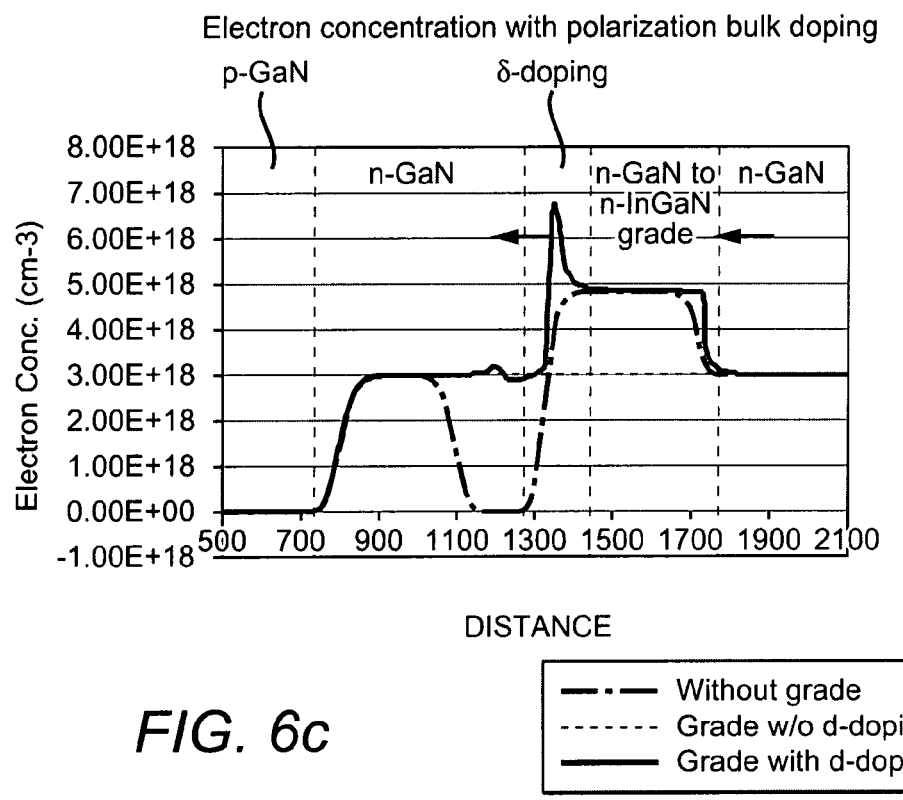

FIG. 6b is a graph of a computer simulation of device 600. The graph shows a first rise 640 in electron concentration at the p-n junction. The Si delta-doped layer 608 yields a sharp spike 642 in electrons followed by an increased level 644 of electrons in the graded layer 604. FIG. 6c is another graph of a computer simulation of the device 600. The graph includes data sets for: a device without a graded layer or Si delta-doped layer; a device with a graded layer but without a Si delta-doped layer; and a device with both a graded layer and a Si delta-doped layer. Vertical dashed lines demarcate the various layers within the device for ease of reference.

Figure 7A:
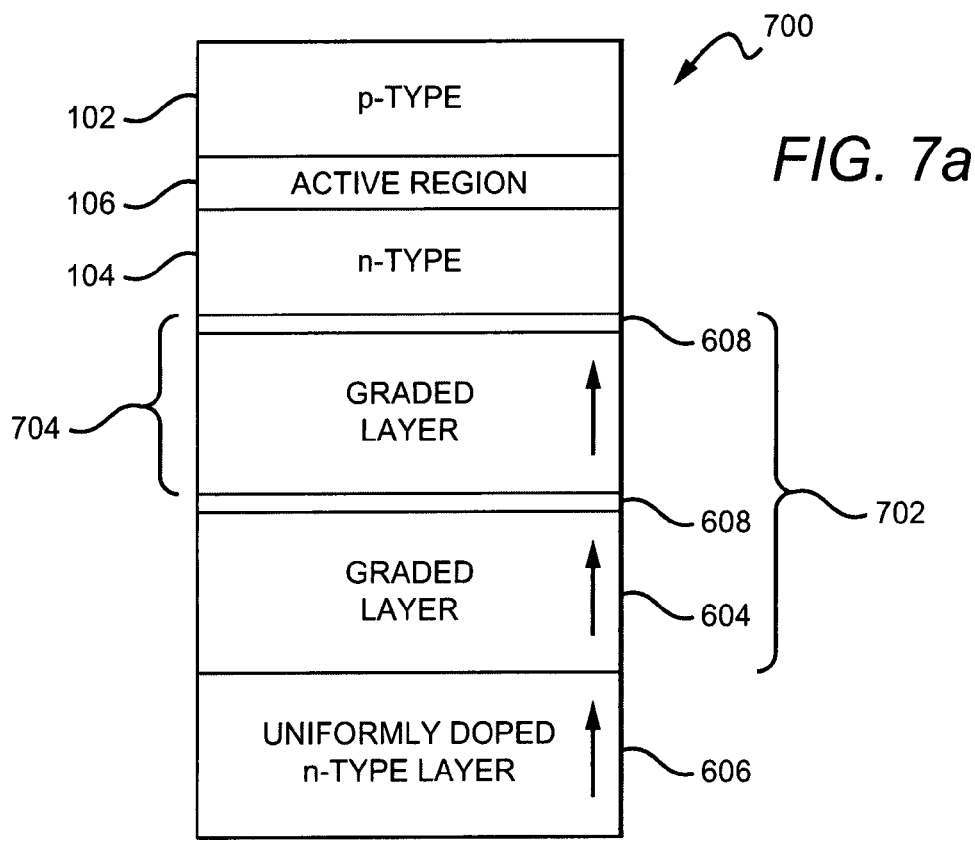
FIG. 7a is a cross-sectional view of a light emitting device according to an embodiment of the present invention, grown along the [000-1] direction or on N-face.
Figure 7B:
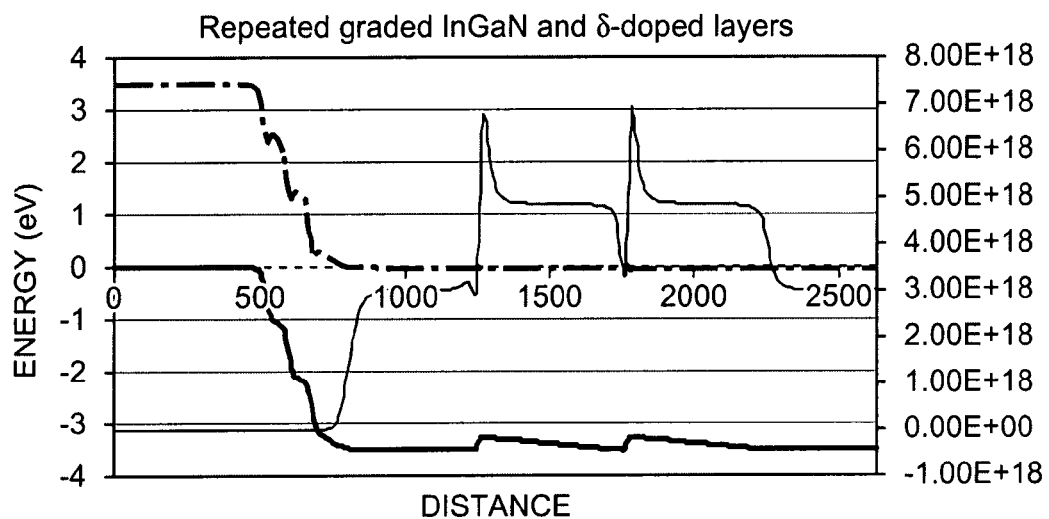

FIG. 7a a cross-section of a semiconductor device 700 according to one embodiment of the present invention. The device 700 is similar to the device 200 and shares several common elements. The device 700 comprises a 3DPG 702. In this embodiment, the graded layer 604 (graded along the [000-1] crystal direction) and Si delta-doped layer 608 form a repeatable stack unit 704. Although only two stack units are shown, it is understood that more or fewer stack units can be incorporated in the 3DPG 702. The device also includes a uniformly doped n-type terminal layer 606. FIG. 7b is a graph of a computer simulation of the device 700 similar to those discussed above which shows the expected electron levels in the device. The graph shows two periods of simulation, each of which corresponds to one of the stack units 704 shown in FIG. 7a.

FIG. 8a illustrates the cross-section of a semiconductor device 800 according to an embodiment of the present invention. The device 800 is similar to the device 300 and shares several common elements. The device features a 3DPG 802. In this embodiment, the 3DPG comprises multiple stack units each of which includes a Si delta-doped layer 608, a graded layer 604 (graded along the [000-1] crystal direction), and a uniformly doped n-type spacer layer 806. Although only two stack units are shown, it is understood that more or fewer stack units can be incorporated into the 3DPG 802. FIG. 8b is a computer simulation of the device 800. The graph shows two periods of simulation, each of which corresponds to one of the stack units 804 shown in FIG. 8a.

Figure 9A:
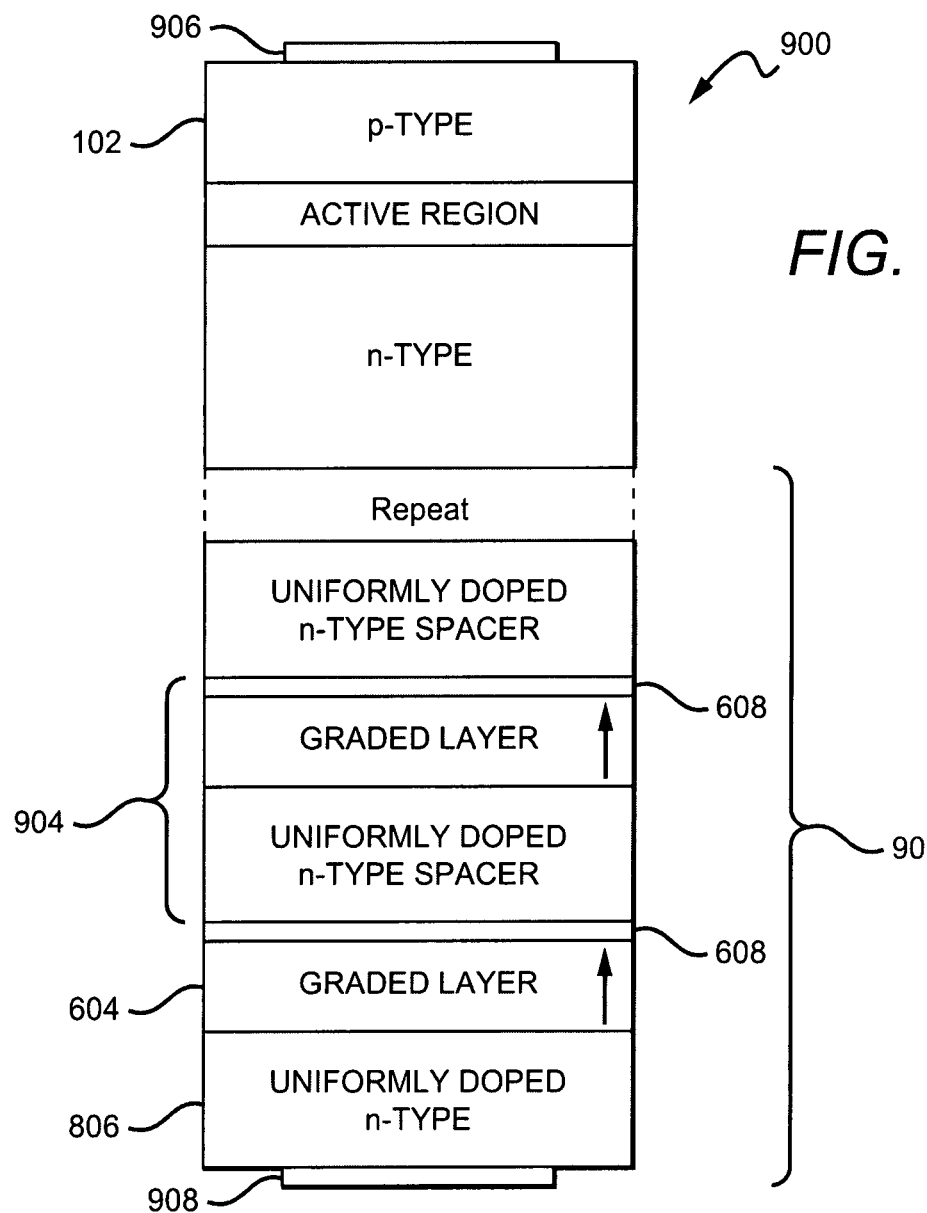
FIG. 9a is a cross-sectional view of a light emitting device, grown along the [000-1] direction or on N-face, according to an embodiment of the present invention.
Figure 9B:
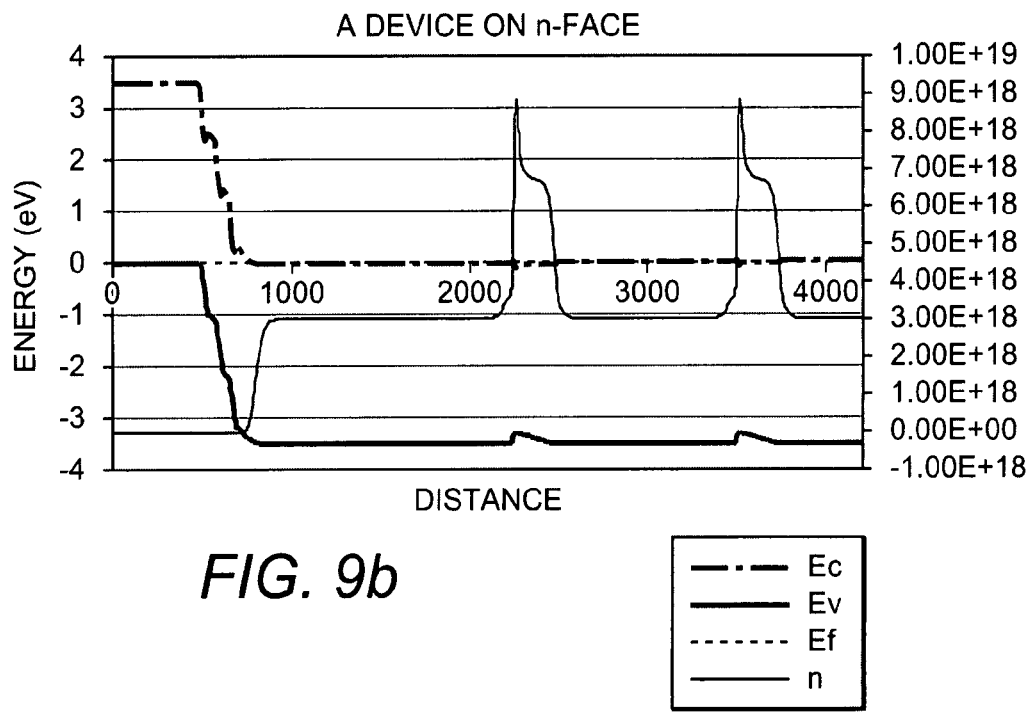

FIG. 9a shows the cross-section of a semiconductor device 900. The device 900 is similar to the device 400 and shares several common elements. The device 900 includes a 3DPG 902. In this embodiment, the 3DPG 902 comprises multiple stack units 904 each of which includes a Si delta-doped layer 608, a graded layer 604, and a uniformly doped n-type spacer layer 806. Although only two stack units 904 are shown, it is understood that stack unit 904 can be repeated many times within the 3DPG 902. In a preferred embodiment the stack unit 904 is repeated 15-20 times within the 3DPG 902. The device 900 also comprises p- and n-contacts 906, 908 disposed on the ends of the device 900 such that the p-contact 906 provides a connection to the p-type layer 102 and the n-contact 908 provides a connection to the n-type side of the device 900. The contacts 906, 908 are connected to an external voltage device (not shown) to bias the device during operation. FIG. 9b is a graph of a computer simulation of the device 900. The graph shows two periods of simulation, each of which corresponds to one of the stack units 904 shown in FIG. 9a. A full graph of the preferred embodiment would show between 15 and 20 similar periods, one for each stack unit included in the device.

Figure 10B:
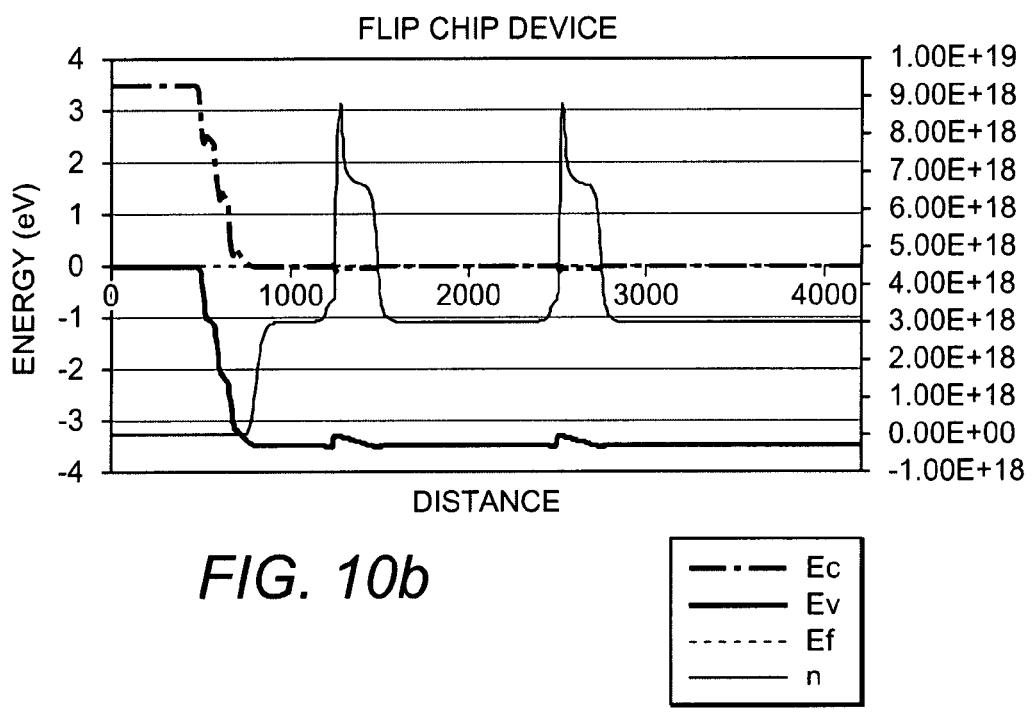
Figure 10A:
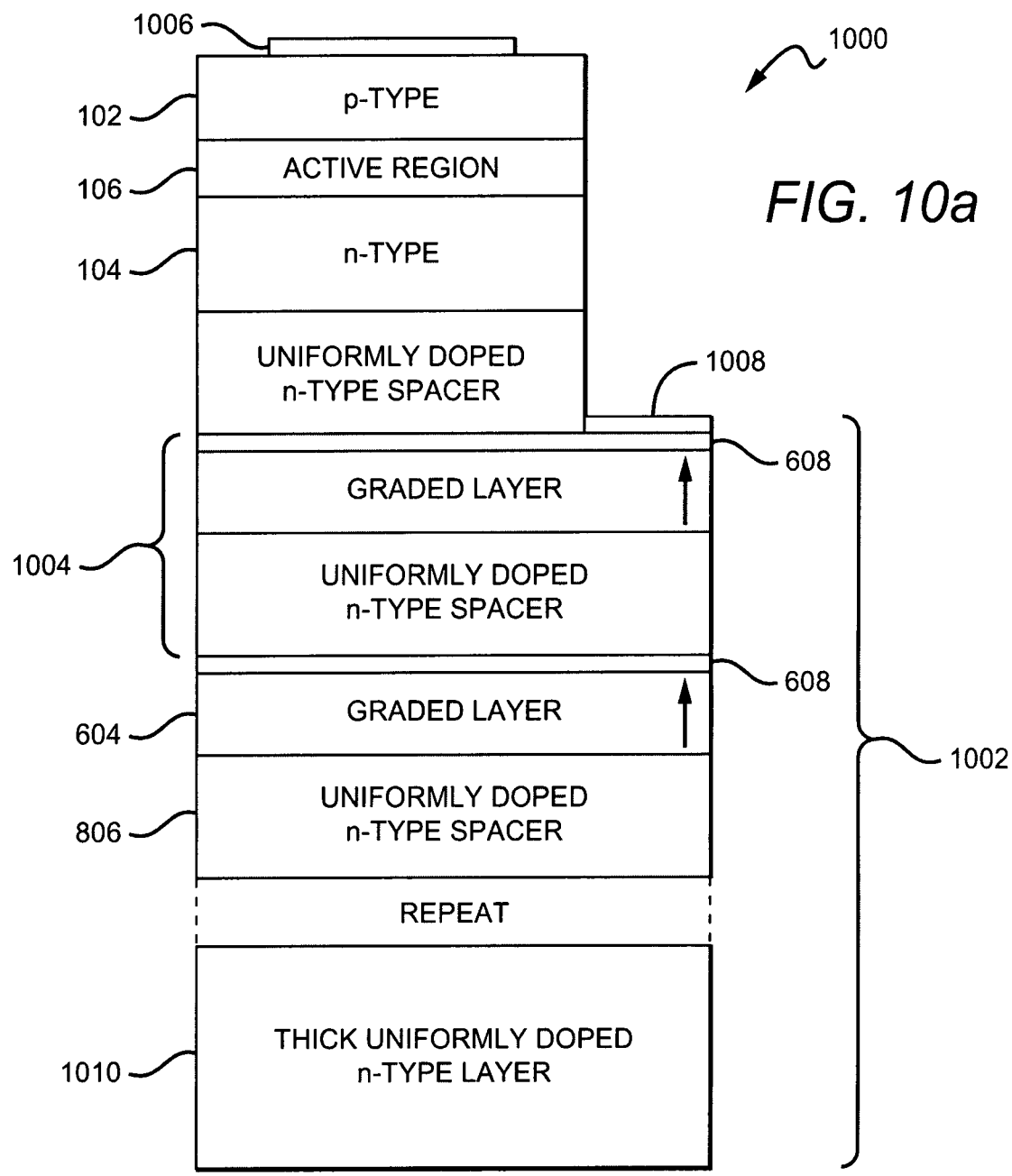
FIG. 10a is a cross-sectional view of a light emitting device, grown along the [000-1] direction or on N-face, according to an embodiment of the present invention.

FIG. 10a illustrates a cross-section of a semiconductor device 1000 according to an embodiment of the present invention. The device 1000 is similar to device 500 and shares several common elements. The device 1000 comprises a 3DPG 1002 which has several repeatable stack units 1004, each of which includes a Si delta-doped layer 608, a graded layer 604 (graded along the [000-1] crystal direction), and a uniformly doped n-type spacer layer 806. Although only two stack units 1004 are shown, a preferred embodiment has 15-20 stack units within the 3DPG 1002. The device 1000 was formed by a flip-chip process with both the p-contact 1006 and the n-contact 1008 disposed on the top side of the device 1000 as shown. Flip-chip processes are known in the art.

In this embodiment, the n-contact 1008 contacts one of the graded layers 604 within the 3DPG structure 1002 from the top side. Thus, the current moves laterally through the device 1000. It is also possible to contact any of the other layers within the 3DPG structure 1002 with the n-contact 1008. The device may be etched down to the appropriate layer as shown in FIG. 10a. Alternatively, a hole may be formed from the top surface with a via providing a connection to the n-contact below, or the 3DPG layers may be contacted from the side of the device. Other methods of connection may also be used. A thick uniformly doped n-type layer 1010 is disposed on the end of the device 1000 opposite the p-type layer 102. The thick layer 1010 can provide mechanical support for the device 1000.

FIG. 10b is a graph of a computer simulation of the device 1000. Only two periods are shown which correspond to the two stack units 1004 in FIG. 10a. It is understood that additional periods would be shown for each additional stack unit included in the 3DPG 1002.

Although the present invention has been described in detail with reference to certain preferred configurations thereof, other versions are possible. Therefore, the spirit and scope of the invention should not be limited to the versions described above.

I claim:

1. A light emitting device, comprising:
    an n-type semiconductor layer;
    a p-type semiconductor layer;
    an active region interposed between said n-type layer and said p-type layer; and
    a three-dimensional polarization-graded (3DPG) structure disposed on said n-type layer opposite said active region, said 3DPG structure comprising at least one repeatable stack unit, said 3DPG structure having a wurtzite crystal structure grown along the [0001]-crystal direction;
    wherein said repeatable stack unit comprises:
        a retrograded layer that is compositionally retrograded from a first material to a second material over a grading distance, said retrograded layer disposed proximate to said n-type layer such that said second material is closest to said n-type layer; and
        a silicon (Si) delta-doped layer disposed adjacent to said retrograded layer opposite said n-type layer.

2. The light emitting device of claim 1, wherein said n-type semiconductor layer comprises n-GaN and is approximately 3 microns thick.

3. The light emitting device of claim 1, further comprising a p-contact disposed on said p-type layer opposite said active region.

4. The light emitting device of claim 1, further comprising an n-contact disposed on said 3DPG structure.

5. The light emitting device of claim 1, further comprising a n-contact and a p-contact that are accessible from the same side of said device, said n-contact disposed to provide an electrical connection to said 3DPG structure.

6. The light emitting device of claim 1, wherein said retrograded layer has a linear compositional grading.

7. The light emitting device of claim 1, wherein said retrograded layer has a nonlinear compositional grading.

8. The light emitting device of claim 1, said repeatable stack unit further comprising an n-type spacer layer disposed adjacent to said Si delta-doped layer opposite said retrograded layer.

9. The light emitting device of claim 8, wherein said n-type spacer layer is uniformly doped.

10. The light emitting device of claim 9, wherein said repeatable stack unit is repeated 15 to 20 times within said 3DPG structure.

11. The light emitting device of claim 9, wherein said retrograded layer is approximately 25 nm thick.

12. The light emitting device of claim 9, wherein said Si delta-doped layer is approximately 1 nm thick.

13. The light emitting device of claim 1, wherein said first material comprises indium gallium nitride of a first composition ($In_xGa_{1-x}N$) and said second material comprises indium gallium nitride of a second composition ($In_yGa_{1-y}N$), where x is greater than y and both x and y range between 0 and 1, inclusive.

14. The light emitting device of claim 13, wherein x equals 0.1 and y equals 0.

15. The light emitting device of claim 1, wherein said device is a polar nitride-based device.

16. The light emitting device of claim 1, wherein said device comprises a vertically conducting light emitting diode (LED).

17. The light emitting device of claim 1, wherein said device comprises a flip-chip LED.

18. The light emitting device of claim 1, wherein said n-type semiconductor layer comprises n-GaN and has a thickness of at least 500 angstroms.

19. A current spreading device, comprising:
    a retrograded layer that is compositionally retrograded from a first material to a second material over a grading distance; and
    a silicon (Si) delta-doped layer disposed adjacent to said retrograded layer, such that said first material is proximate to said Si delta-doped layer;
    an n-type spacer layer disposed adjacent to said Si delta-doped layer opposite said retrograded layer such that said Si delta-doped layer is interposed between said retrograded layer and said spacer layer;
    wherein said retrograded layer, said Si delta-doped layer, and said n-type spacer layer are arranged in a repeatable stack that is repeated 15-20 times within said current spreading device.

20. The current spreading device of claim 19, wherein said retrograded layer has a bulk three-dimensional polarization-induced background charge.

21. The current spreading device of claim 19, wherein said retrograded layer and said spacer layer both comprise n-type semiconductor materials.

22. The current spreading device of claim 19, wherein said first material comprises indium gallium nitride of a first composition ($In_xGa_{1-x}N$) and said second material comprises indium gallium nitride of a second composition ($In_yGa_{1-y}N$), where x is greater than y and both x and y range between 0 and 1, inclusive.

23. The current spreading device of claim 22, wherein x equals approximately 0.1 and y equals approximately 0.

24. The current spreading device of claim 19, wherein said retrograded layer is approximately 25 nm thick.

25. The current spreading device of claim 19, wherein said Si delta-doped layer is approximately 1 nm thick.

26. A semiconductor device, comprising:
a retrograded layer that is compositionally retrograded from a first material to a second material over a grading distance; and
a silicon (Si) delta-doped layer disposed adjacent to said graded layer, such that said first material is proximate to said Si delta-doped layer;
wherein said first material comprises indium gallium nitride of a first composition ($In_xGa_{1-x}N$) where x is approximately 0.1, and said second material comprises gallium nitride (GaN).

27. A semiconductor device, comprising:
multiple stack units, each said stack unit comprising:
a retrograded layer that is compositionally retrograded from a first material to a second material over a grading distance, said first material comprising a component material in a first percentage and said second material comprising a lower percentage of said component material than said first material;
a uniformly doped spacer layer; and
a delta-doped layer interposed between said retrograded layer and said uniformly doped spacer layer,
wherein said retrograded layer first material is directly adjacent to said delta-doped layer.

28. The semiconductor device of claim 27, wherein multiple repeatable stack units are arranged in a stack structure.

29. The semiconductor device of claim 27, wherein said retrograded layer has a bulk three-dimensional polarization-induced background charge.

30. A semiconductor device, comprising:
multiple stack units, each said stack unit comprising:
a retrograded layer that is compositionally retrograded from a first material to a second material over a grading distance, said first material comprising a component material in a first percentage and said second material comprising a lower percentage of said component material than said first material;
a uniformly doped spacer layer, wherein said retrograded layer and said spacer layer both comprise n-type semiconductor materials; and
a delta-doped layer interposed between said retrograded layer and said uniformly doped spacer layer, wherein said retrograded layer first material is adjacent to said delta-doped layer.

31. The semiconductor device of claim 27, wherein said retrograde layer has a linear compositional grading to provide a uniform charge profile.

32. The semiconductor device of claim 27, wherein said retrograded layer has a nonlinear compositional grading to provide a non-uniform charge profile.

* * * * *